(12) United States Patent
Fushimi et al.

(10) Patent No.: US 7,999,277 B2
(45) Date of Patent: Aug. 16, 2011

(54) LIGHT EMITTING DEVICE AND PRODUCTION METHOD OF SAME

(75) Inventors: Hiroshi Fushimi, Tokyo (JP); Kengo Nishiyama, Saga (JP); Kouji Kudou, Saga (JP); Itsuki Yamamoto, Saga (JP); Kazuma Mitsuyama, Saga (JP)

(73) Assignee: C. I. Kasei Company, Limited, Tokyo (JP)

( * ) Notice: Subject to any disclaimer, the term of this patent is extended or adjusted under 35 U.S.C. 154(b) by 118 days.

(21) Appl. No.: 12/312,341

(22) PCT Filed: Nov. 7, 2007

(86) PCT No.: PCT/JP2007/072043
§ 371 (c)(1),
(2), (4) Date: May 5, 2009

(87) PCT Pub. No.: WO2008/056813
PCT Pub. Date: May 15, 2008

(65) Prior Publication Data
US 2010/0038662 A1 Feb. 18, 2010

(30) Foreign Application Priority Data

Nov. 8, 2006 (JP) ................. 2006-302730
Nov. 20, 2006 (JP) ................. 2006-312763
Nov. 27, 2006 (JP) ................. 2006-318811

(51) Int. Cl.
*H01L 33/00* (2010.01)

(52) U.S. Cl. .............. 257/98; 257/99; 257/E33.056; 257/E33.066; 257/E33.067; 438/26; 438/29

(58) Field of Classification Search ............. 257/98, 257/99, E33.056, E33.066, E33.067; 438/26, 438/29
See application file for complete search history.

(56) References Cited

U.S. PATENT DOCUMENTS
5,523,589 A * 6/1996 Edmond et al. ............ 257/77
(Continued)

FOREIGN PATENT DOCUMENTS
CN 1866561 A 11/2006
(Continued)

OTHER PUBLICATIONS
Office action dated Mar. 31, 2010 issued in corresponding Chinese Application No. 200780041393.9; 5pp.
(Continued)

*Primary Examiner* — Tu-Tu V Ho
(74) *Attorney, Agent, or Firm* — Christie, Parker & Hale LLP

(57) ABSTRACT

A light emitting device, and a production method thereof, is provided having for a light source thereof a vertical geometry light emitting diode, that allows a large current to flow through the vertical geometry light emitting diode and takes into consideration the dissipation of heat occurring at that time or the expansion and contraction of a metal member due to thermal stress caused by that heat. The light emitting device at least comprises a package having a plurality of mutually separated package electrodes; a vertical geometry light emitting diode having a light emitting layer positioned between a p-type semiconductor layer and an n-type semiconductor layer, an upper partial electrode of the uppermost layer, and a lower electrode of the lowermost layer, wherein the lower electrode is joined onto one of the package electrodes; and, a conductive connecting member that connects the upper electrode of the vertical geometry light emitting diode with another of package electrodes; wherein the junction between said one of the package electrodes and the lower electrode, the junction between the upper electrode and the conductive connecting member, and the junction between the conductive connecting member and said other of package electrodes are made with solder.

20 Claims, 17 Drawing Sheets

U.S. PATENT DOCUMENTS

| | | | |
|---|---|---|---|
| 2001/0000209 A1* | 4/2001 | Krames et al. | 257/94 |
| 2006/0091409 A1* | 5/2006 | Epler et al. | 257/95 |
| 2006/0261292 A1 | 11/2006 | Kim et al. | |
| 2006/0279949 A1* | 12/2006 | Shin et al. | 362/236 |

FOREIGN PATENT DOCUMENTS

| | | |
|---|---|---|
| JP | 2001-244508 | 9/2001 |
| JP | 2003-303999 | 10/2003 |
| JP | 2005-79167 | 3/2005 |
| JP | 2005-116579 | 4/2005 |
| JP | 2006-128710 | 5/2006 |
| JP | 2006-216764 | 8/2006 |
| JP | 2006-278766 | 10/2006 |

OTHER PUBLICATIONS

International Search Report, dated Feb. 19, 2008, corresponding to PCT/JP2007/072043.

* cited by examiner

LIGHT EMITTING DEVICE AND PRODUCTION METHOD OF SAME

CROSS-REFERENCE TO RELATED APPLICATION

This application is a National Phase Patent Application and claims the priority of International Application Number PCT/JP2007/072043, filed on Nov. 7, 2007, which claims priority of Japanese Patent Application Number 2006-302730, filed on Nov. 8, 2006, Japanese Patent Application Number 2006-312763, filed on Nov. 20, 2006, and Japanese Patent Application Number 2006-318811, filed on Nov. 27, 2006.

TECHNICAL FIELD

The present invention relates to a light emitting device having for a light source thereof a vertical geometry light emitting diode provided with an upper electrode and a lower electrode, and to a production method thereof. More particularly, the present invention relates to a light emitting device that allows a large current to flow through a vertical geometry light emitting diode and takes into consideration the dissipation of heat occurring at that time or the expansion and contraction of a metal member due to thermal stress caused by that heat, and to a production method thereof. In addition, the present invention relates to a light emitting device capable of preventing damage to a light emitting layer caused by vibrations or heat by using electrically conductive connecting members joined by soldering instead of connecting gold wires for supplying electrical power to a light emitting diode by wire bonding, and to a production method thereof.

BACKGROUND ART

FIGS. 18A and 18B are a schematic drawing and an overhead view for explaining a light emitting diode assembly in the form of a light emitting device of the prior art having a light emitting diode as the light source thereof. In FIGS. 18A and 18B, a light emitting diode assembly 60 is composed of a printed wiring board 61, a submounting substrate 62 provided on the printed wiring board 61, a plastic hollow body 63 surrounding the periphery of the submounting substrate 62, a light emitting diode 65, and a transparent sealing resin 66 covering the light emitting diode 65.

The plastic hollow body 63 is integrally molded with a lead frame 64 by a thermosetting resin having an epoxy resin as a main component thereof. The printed wiring board 61 has printed wires 611 for connecting with a control circuit not shown for operating the light emitting diode 65 formed in a desired pattern by etching and the like. The submounting substrate 62 has a pair of wires 622 formed in the upper surface thereof by forming a vapor deposition pattern using etching or a mask.

In the plastic hollow body 63, the lead frame 64 passes through a sidewall. The plastic hollow body 63 is integrally produced by so-called insert or outsert molding (injection molding) in which a portion of the lead frame 64 is embedded therein during molding. The plastic hollow body 63 reflects light emitted by the light emitting diode 65 with the surface of an inner wall thereof.

The light emitting diode 65 is provided with two electrodes 623 at the bottom, is cut out from a semiconductor wafer by dicing, and has the electrodes 623 connected to the wires 622 of the submounting substrate 62.

The transparent sealing resin 66 has heat resistance, is filled into the plastic hollow body 63, and comprises a flat or convex lens.

FIGS. 19A and 19B are a cross-sectional view and overhead view for schematically explaining a light emitting device of the prior art having for a light source thereof a vertical geometry light emitting diode, and FIG. 19C is a schematic drawing for explaining a vertical geometry light emitting diode. A light emitting device 51 of the prior art shown in FIGS. 19A and 19B is composed of metal substrates 53 and 54, a slit 55 located between the metal substrates 53 and 54 (in some cases, a filling material is filled therein), a vertical geometry light emitting diode 52 attached to one metal substrate 53, gold wires 511 and 512 for connecting another metal substrate 54 with an upper electrode 523 of the vertical geometry light emitting diode 52, a reflector 56, a transparent sealing resin 57 filled into an opening surrounding the vertical geometry light emitting diode 52 in the reflector 56, and a fluorescent material-containing film 58 provided on the upper portion of the reflector opening, and connection between the metal substrate 54 and the upper electrode 523 of the vertical geometry light emitting diode 52 is made by wire bonding using the gold wires 511 and 512. As shown in FIG. 19A, the reflector 56 is composed of a nearly cylindrical body having an opening comprising a reflecting portion inclined so as to spread upward.

As shown in FIG. 19C, the vertical geometry light emitting diode 52 is at least composed of a lower electrode 521, a light emitting layer 52' formed above the lower electrode 521, a transparent conductive film 522 formed above the light emitting layer 52', and an upper electrode 523 formed on the transparent conductive film 522.

In the light emitting diode package described in JP 2001-244508 A, a lower electrode of a vertical geometry light emitting diode is attached to one metal substrate, while an upper electrode of the vertical geometry light emitting diode is connected to another insulated metal substrate with bonding wires.

In a light emitting diode package of the prior art, a resin is inserted into an insulated portion of a metal core. A production method for this type of light emitting diode package is described in, for example, JP 2005-116579 A.

A known example of a light emitting device that uses a surface-mounted light emitting diode is a light emitting device in which a submounting substrate in which a light emitting diode is sealed with a sealing resin is mounted on separate metal core substrates with an insulating adhesive. A light emitting device that uses this type of surface-mounted light emitting diode as a light source is described in, for example, JP 2003-303999 A.

Flip chip light emitting diodes of the submounted type offer the advantage of allowing all emitted light to be radiated to the outside since they do not have an electrode in the upper portion thereof.

On the other hand, vertical geometry light emitting diodes have been developed in recent years that have superior performance to flip chip light emitting diodes. In contrast to vertical geometry light emitting diodes allowing a larger current flow and improved luminosity, since configurations of the submounted type have difficulty in dissipating heat generated from the light emitting diode due to poor thermal conductivity, the package easily reaches a high temperature thereby resulting in the disadvantages of wiring disconnections occurring during the course of use or failure of the light emitting diode itself. In addition, submounted types also had the problem of poor productivity.

Vertical geometry light emitting diodes have come to be larger, demonstrate better emission efficiency and yield higher luminosity.

In light emitting devices of the prior art having for a light source thereof a vertical geometry light emitting diode, the upper electrode of the light emitting diode and a metal substrate are connected by wire bonding as previously described. The gold wires used for wire bonding are connected to the upper electrode of the vertical geometry light emitting diode by thermocompression and ultrasonic oscillation by, for example, a robot (automated special-purpose machine). Consequently, in the case of connections by bonding using gold wires, vibrations and pressure generated impart a stimulus to the semiconductor layer and light emitting layer of the upper portion of the vertical geometry light emitting diode through the upper electrode, possibly resulting in damage thereto. Consequently, it is necessary to subtly adjust the pressure and ultrasonic oscillation of the wire bonder to prevent damage to the semiconductor layer and light emitting layer of a vertical geometry light emitting diode caused by vibrations and pressure, resulting in a tendency for an increase in the connection resistance of the gold wires.

However, it was necessary for further increase the flow of current to increase the luminance of light emitting diodes. In this case, since there are limitations on how much the diameter of gold wire can be increased, a plurality of wires were used to increase current capacity. Even if a plurality of gold wires are used, since greater heat is generated from the gold wires when current capacity is increased, adhered portions became defective over the course of time. In addition, when a large current is allowed to flow through gold wires connecting the upper electrode of a vertical geometry light emitting diode attached to one substrate and another substrate, thermal stress occurs due to the generation of heat, thereby resulting in the problem of disconnections or causing the vertical geometry light emitting diode to burn out due to the resistance at connection of gold wire with the upper electrode or the substrate.

Moreover, light emitting devices of the prior art having as a light source thereof a vertical geometry light emitting diode are not only susceptible to the occurrence of connection defects over time with respect to providing a plurality of gold wires, but also had the problem of poor productivity attributable to an increase in the number of production steps and the need to subtly adjust the pressure and ultrasonic oscillation of the wire bonder.

DISCLOSURE OF THE INVENTION

In order to solve the aforementioned problems, an object of the present invention is to provide a light emitting device having for a light source thereof a vertical geometry light emitting diode that has superior productivity, is able to withstand large current and thermal stress, and the constituent members thereof are integrated while maintaining high strength without any impairment of the integrity thereof over time, and to provide a production method thereof.

The light emitting device according to the present invention at least comprises:
a package having a plurality of mutually separated package electrodes;
a vertical geometry light emitting diode having a light emitting layer positioned between a p-type semiconductor layer and an n-type semiconductor layer, an upper partial electrode of the uppermost layer, and a lower electrode of the lowermost layer, wherein the lower electrode is joined onto one of the package electrodes; and,
a conductive connecting member that connects the upper electrode of the vertical geometry light emitting diode with another of the package electrodes,
wherein the junction between said one of the package electrodes and the lower electrode, the junction between the upper electrode and the conductive connecting member, and the junction between the conductive connecting member and said other of the package electrodes are made with solder.

The package can be comprised of a metal substrate having mutually separated substrate portions serving as a plurality of package electrodes, and a reflector joined to the metal substrate. The plurality of substrate portions are held together with the reflector and integrity is maintained thereby in the form of a light emitting device.

The package can also be comprised of a ceramic substrate, a plurality of package electrodes formed mutually separated on the ceramic substrate, and a reflector joined to the ceramic substrate.

The reflector has an opening that surrounds the vertical geometry light emitting diode the lower electrode of which is joined to said one of the package electrodes. A transparent sealing material may be filled into the reflector opening.

The reflector may be an alumina-based or alumina and glass compound ceramic member, and can be joined to the metal substrate or ceramic substrate by a resin-based, glass-based or brazing material-based adhesive.

The transparent sealing material filled into the reflector opening can be a resin or elastomer having a Shore A hardness (rubber hardness) of 15 to 85 and preferably 20 to 80. More preferably, the transparent sealing material is a one-pack or two-pack type of thermosetting silicone-based resin or elastomer.

A fluorescent material-containing film may also be provided on the upper portion of the reflector opening.

There are no particular limitations on the vertical geometry light emitting diode used in the light emitting device of the present invention, and for example, a gallium nitride-based vertical geometry light emitting diode can be used preferably.

The conductive connecting member can be a metal member having ribbon-shaped arms or a metal member in the shape of a ribbon overall that is made of gold, silver, copper or copper plated with at least one type of metal selected from the group consisting of gold, silver and nickel on the surface thereof. The conductive connecting member is preferably a ribbon-shaped gold member.

The light emitting device of the present invention can be produced by a method for producing a light emitting device in which a light emitting diode is joined to a package having a plurality of mutually separated package electrodes, comprising the steps of:
mounting a vertical geometry light emitting diode, having a light emitting layer positioned between a p-type semiconductor layer and an n-type semiconductor layer, an upper partial electrode of the uppermost layer and a lower electrode of the lowermost layer, on a package by joining the lower electrode to one of the package electrodes, and
connecting the upper partial electrode of the vertical geometry light emitting diode to another of package electrodes with a conductive connecting member,
wherein said one of the package electrodes and the lower electrode, the upper electrode and the conductive connecting member, and the conductive connecting member and said other of package electrodes are respectively joined with solder.

BRIEF DESCRIPTION OF THE DRAWINGS

FIG. 12A is a drawing for explaining the filling of an insulating material into a slit that separates package electrodes in the form of metal substrate portions, while

FIGS. 19A and 19B are drawings for explaining a light emitting device of the prior art in which a vertical geometry light emitting diode is connected with gold wire, while

BEST MODE FOR CARRYING OUT THE INVENTION

In a light emitting device of the present invention having for a light source thereof a vertical geometry light emitting diode, the vertical geometry light emitting diode is mounted on a package by joining a lower electrode thereof to one of the package electrodes, while an upper electrode of the light emitting diode is connected to another package electrode by an electrically conductive connecting member.

In the case where a substrate that comprises the package is made of metal, each of two mutually separated substrate portions that comprise the substrate can be used as two mutually separated package electrodes.

The package substrate in the light emitting device of the present invention may also be made of ceramic. In this case, the package electrodes are formed mutually separated using a conductor material on the ceramic substrate.

A package having three or more package electrodes can also be used.

Figure 1A:
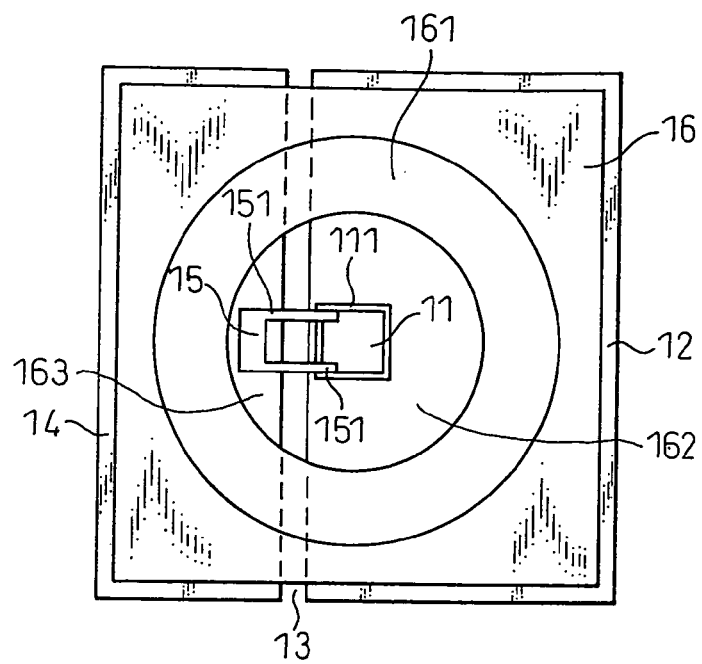
FIGS. 1A to 1C are schematic drawings for explaining an example of a light emitting device of the present invention that uses a metal substrate package.
Figure 1B:
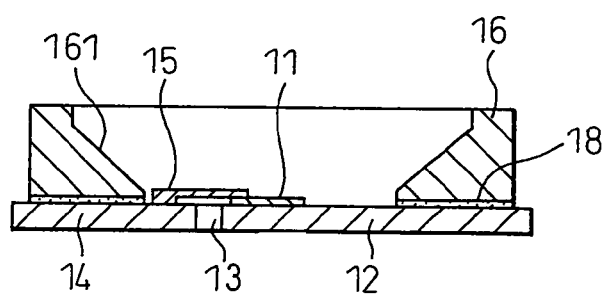
Figure 1C:
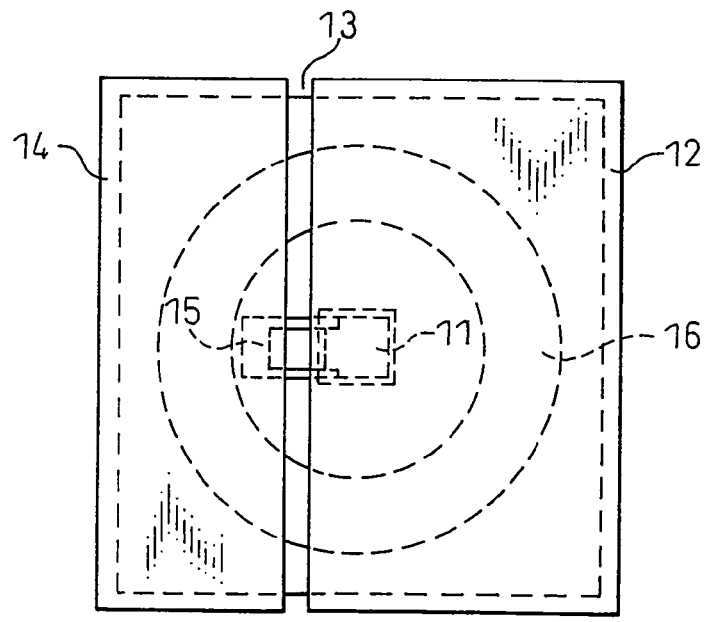

The following provides an explanation of a light emitting device of the present invention that uses a package having package electrodes in the form of two metal substrate portions with reference to FIGS. 1A to 1C. FIG. 1A is a plan view of the light emitting device, FIG. 1B is a cross-sectional view, and FIG. 1C is a bottom view.

In the example shown in FIGS. 1A to 1C, the package has package electrodes in the form of a pair of substrate portions 12 and 14. A slit 13 is provided between the substrate portions 12 and 14, and substrate portions 12 and 14 are mutually insulated. A vertical geometry light emitting diode 11 is mounted to one substrate portion 12 by joining a lower electrode (not shown), while an upper electrode 111 is connected to the other substrate portion 14 using a conductive connecting member 15.

To the substrate portions 12 and 14, a hollow reflector 16, having a penetrating opening provided with a reflecting surface 161 inclined by forming so as to spread upward, is coupled with an adhesive 18 so as to surround the region where the vertical geometry light emitting diode 11 is mounted (in the following reference drawings, that corresponding to adhesive 18 in FIG. 1B is not shown to simplify the drawings). Although the substrate portions 12 and 14 are separated by the slit 13, they are collectively rigidly held by the reflector 16 and the adhesive 18. The substrate portions 12 and 14 separated (insulated) by the slit 13 can be used as package electrodes for supplying electrical power to the light emitting diode by connecting each to a power supply (not shown).

The shape of the slit 13 that separates the substrate portions 12 and 14 may be linear as shown in the drawings, or can be changed to an arbitrary shape such as a curve, cross, letter T or letter H. The slit 13 can also be filled with an insulating material (not shown).

Plating layers 162 and 163 made of gold or silver, for example, are formed on the surfaces of the substrate portions 12 and 14 at the regions to the inside the opening of the reflector 16 (regions where the light emitting diode is mounted) to efficiently reflect light emitted by the vertical geometry light emitting diode 11.

Figure 2A:
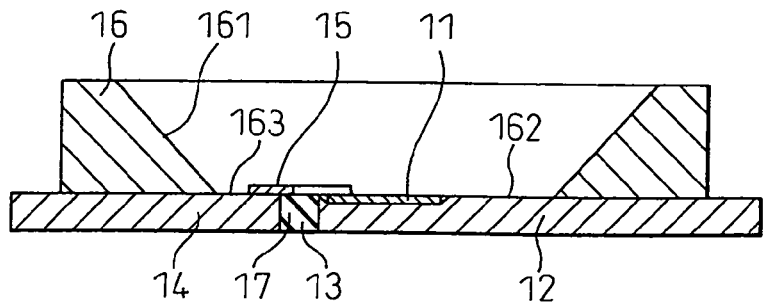
FIGS. 2A to 2C are schematic drawings for explaining another example of a light emitting device of the present invention that uses a metal substrate package.
Figure 2B:
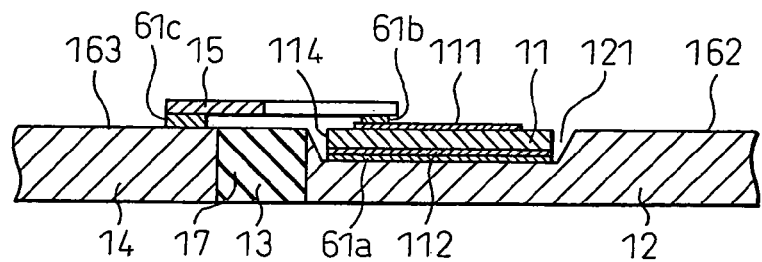
Figure 2C:
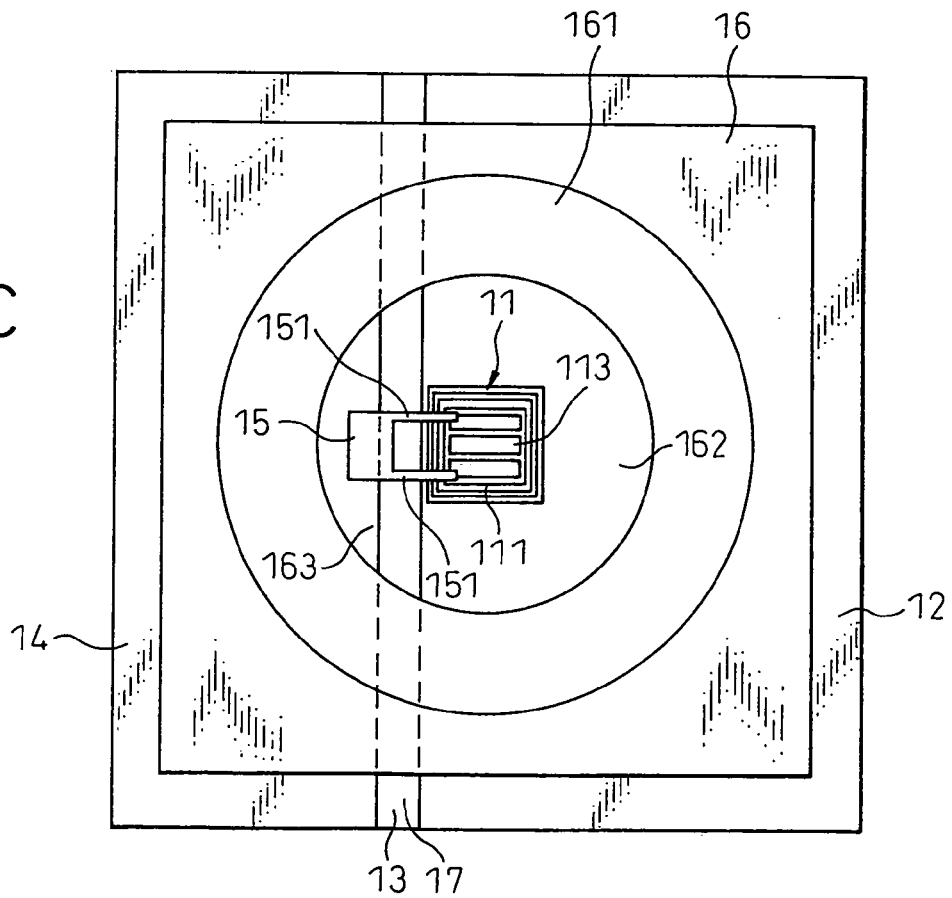

The following provides an explanation of another example of a light emitting device of the present invention that uses a metal substrate having two substrate portions with reference to FIGS. 2A to 2C. FIG. 2A is a cross-sectional view of the light emitting device, FIG. 2B is a partially enlarged view of FIG. 2A, and FIG. 2C is a plan view of the light emitting device.

In the light emitting device shown in FIGS. 2A to 2C, an insulating material 17 is filled into the slit 13. In addition, the vertical geometry light emitting diode 11 is housed in a housing recess 121 provided in one substrate portion 12. The depth of the recess 121 is preferably such that the upper surface of the upper electrode 111 of the light emitting diode 11 housed therein is at the same height as the upper surface of the other substrate portion 14.

A solder 61a that joins one of the package electrodes in the form of the substrate portion 12 and a lower electrode 112, a solder 61b that joins the upper electrode 111 and the conductive connecting member 15, and a solder 61c that joins the conductive connecting member 15 and the other package electrode in the form of the substrate portion 14 are shown in FIG. 2B.

In the light emitting devices shown in FIGS. 1A to 1C and FIGS. 2A to 2C, the vertical geometry light emitting diode 11 is provided with the upper electrode 111 and the lower electrode 112 (the lower electrode 112 is shown only in FIG. 2B). The vertical geometry light emitting diode 11 is mounted to the one substrate portion 12 by joining the lower electrode 112 thereof, while the upper electrode 111 is connected to the other substrate portion 14 via the conductive connecting member 15.

Figure 3A:
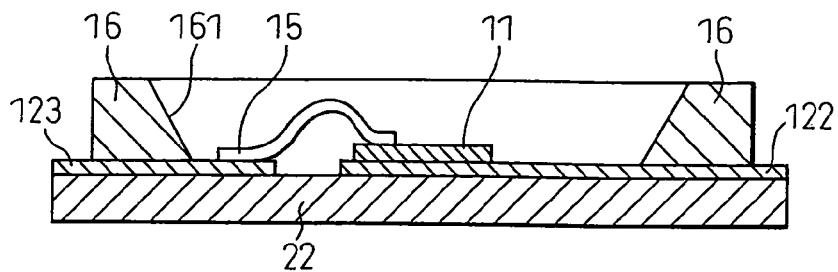
FIGS. 3A to 3C are schematic drawings for explaining an example of a light emitting device of the present invention that uses a ceramic substrate package.
Figure 3B:
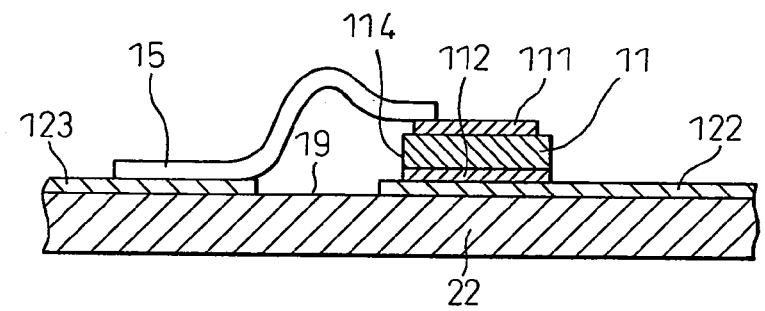
Figure 3C:
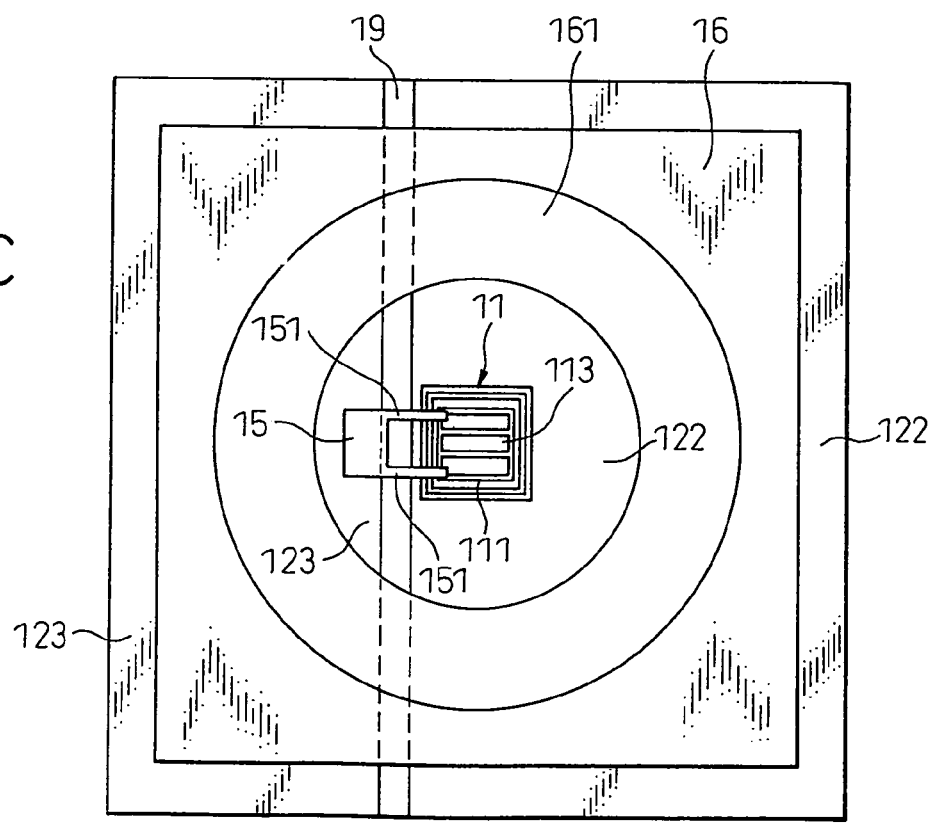

The following provides an explanation of the light emitting device of the present invention that uses a ceramic substrate package with reference to FIGS. 3A to 3C. FIG. 3A is a cross-sectional view of the light emitting device, FIG. 3B is a partially enlarged view of FIG. 3A, and FIG. 3C is a plan view of the light emitting device.

In the example shown in FIGS. 3A to 3C, the package has a single ceramic substrate 22. A pair of package electrodes 122 and 123 (FIGS. 3B and 3C) made from an electrically conductive material such as a metal or metal alloy are provided on the ceramic substrate 22 so as to be mutually opposed and separated by an insulating portion 19. The package electrodes 122 and 123 can be formed by, for example, preliminarily coating a paste of an electrically conductive material onto the ceramic substrate 22 using a mask. It is also possible to form the package electrodes by plating. The electrically conductive material is preferably gold or silver. The package electrodes 122 and 123 can be formed over nearly the entire surface of the ceramic substrate 22 juxtaposed about the insulating portion 19 so as to reach the edges of the package in order to connect with a power supply (not shown) for supplying electrical power to the light emitting diode 11. In some cases, package electrodes patterned to a specific shape and dimensions can also be used (such as band-shaped pattern electrodes extending to the edges of the package by forming to the width of the lower electrode of the vertical geometry light emitting diode 11 connected and to nearly the same width as the conductive connecting member 15).

The reflector 16 can be mounted on the ceramic substrate 22 as previously explained with regard to the light emitting device using a metal substrate.

Figure 4:
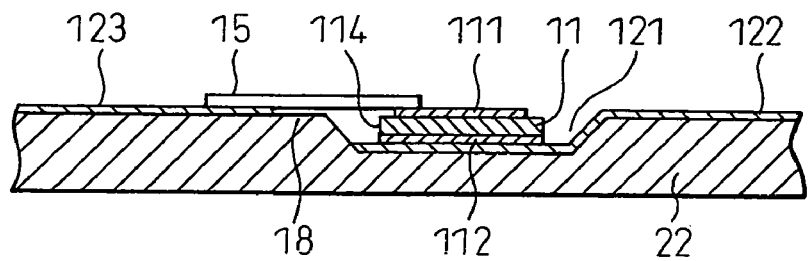
FIG. 4 is a schematic drawing for explaining a ceramic substrate used in a light emitting device of the present invention that is provided with a recess capable of housing a light emitting diode.

As shown in FIG. 4, the ceramic substrate 22 may be provided with the recess 121 capable of housing the light emitting diode 11 as previously explained with regard to the light emitting device having a metal substrate. The depth of the recess 121 is preferably such that the upper surface of the upper electrode 111 of the light emitting diode 11 housed therein is at the same height as the upper surface of the other package electrode 123 separated from the package electrode 122 joined to the light emitting diode 11.

Any arbitrary vertical geometry light emitting diode can be used for the light emitting diode serving as the light source of the light emitting device of the present invention. The vertical geometry light emitting diode typically has a light emitting layer positioned between a p-type semiconductor layer and an n-type semiconductor layer, an upper partial electrode of the uppermost layer and a lower electrode of the lowermost layer.

Examples of vertical geometry light emitting diodes able to be used in the light emitting device of the present invention include:

(1) aluminum-gallium-arsenic (AlGaAs)-based diodes (for emitting infrared or red light);
(2) gallium-arsenic-phosphorous (GaAsP)-based diodes (for emitting red, orange or yellow light);
(3) gallium nitride (GaN)-based diodes (for emitting green, blue, violet or ultraviolet light);
(4) gallium phosphide (GaP)-based diodes (for emitting red, yellow or green light);
(5) zinc selenide (ZnSe)-based diodes (for emitting green or blue light);
(6) aluminum-indium-gallium-phosphorous (AlGaInP)-based diodes (for emitting orange, yellow-orange, yellow or green light);
(7) diamond (C)-based diodes (for emitting ultraviolet light); and,
(8) zinc oxide (ZnO)-based diodes (for emitting near ultraviolet light). These light emitting diodes are supplied by various manufacturers including Cree Inc., SemiLEDs Corp., Toyoda Gosei Co., Ltd., Shin-Etsu Handotai Co., Ltd., Nichia Corp., Osram Corp. and Philips Lumileds Lighting Co.

Methods for producing a vertical geometry light emitting diode include methods using a conductive substrate and methods using a temporary substrate for growing a semiconductor.

In the methods using a conductive substrate, the vertical geometry light emitting diode is produced by laminating an n-type semiconductor layer, a light emitting layer and a p-type semiconductor layer on a conductive substrate, forming an upper partial electrode on the p-type semiconductor layer, and forming a lower electrode beneath the conductive substrate of the lowermost layer.

Figure 5A:
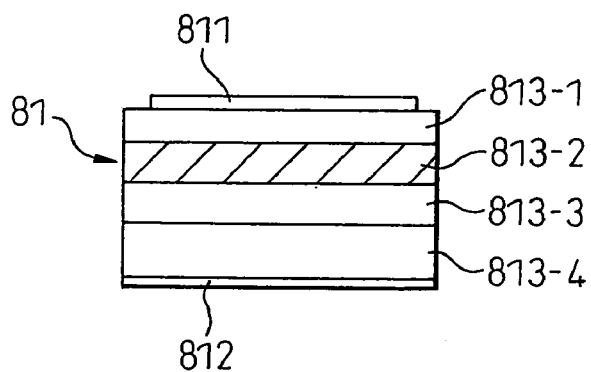
FIGS. 5A and 5B are schematic drawings for explaining vertical geometry light emitting diodes used in light emitting devices of the present invention.

A gallium nitride-based vertical geometry light emitting diode 81 is shown in the schematic drawing of FIG. 5A as a typical example of a vertical geometry light emitting diode produced using a method that uses a conductive substrate. The vertical geometry light emitting diode 81 is at least comprised of a lower electrode 812, a substrate 813-4 positioned on the lower electrode 812, an n-type gallium nitride-based semiconductor layer 813-3 formed on the substrate 813-4, a quantum well structured active layer (light emitting layer) 813-2 formed on the n-type gallium nitride-based semiconductor layer 813-3, a p-type gallium nitride-based semiconductor layer 813-1 formed on the quantum well structured active layer 813-2, and an upper partial electrode 811 formed on the p-type gallium nitride-based semiconductor layer 813-1.

In methods using a temporary substrate, the vertical geometry light emitting diode is produced by laminating an n-type semiconductor layer, a light emitting layer and a p-type semiconductor layer on a temporary substrate such as a sapphire substrate, either joining another conductive substrate or forming a conductive metal substrate by plating on the p-type semiconductor layer, for example, followed by removing the temporary layer, forming an upper partial electrode on the n-type semiconductor layer exposed as a result thereof, and forming a lower electrode on the exposed surface of the conductive substrate or metal substrate of the lowermost layer.

Figure 5B:
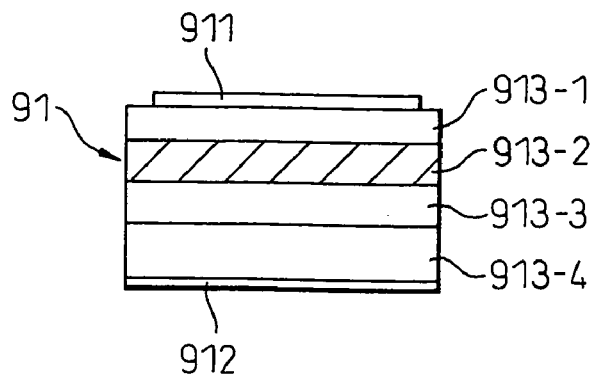

An example of another gallium nitride-based vertical geometry light emitting diode produced using a temporary substrate is shown in the schematic drawing of FIG. 5B. The vertical geometry light emitting diode 91 shown in this drawing is at least comprised of a lower electrode 912, a substrate 913-4 positioned on the lower electrode 912, a p-type gallium nitride-based semiconductor layer 913-3 formed on the substrate 913-4, a quantum well structured active layer (light emitting layer) 913-2 formed on the p-type gallium nitride-based semiconductor layer 913-3, an n-type gallium nitride-based semiconductor layer 913-1 formed on the quantum well structured active layer 913-2, and an upper partial electrode 911 formed on the n-type gallium nitride-based semiconductor layer 913-1.

A gallium nitride-based vertical geometry light emitting diode as explained with FIGS. 5A and 5B can be acquired, for example, under the trade name EZ1000 (blue) from Cree Inc., or under the trade name SL-V-B40AC (blue), SL-V-G40AC (green) or SV-V-U40AC (ultraviolet, near ultraviolet) from SemiLEDs Corp.

A conductive connecting member (not shown) connected to upper partial electrode 811 (FIG. 5A) or upper electrode 911 (FIG. 5B) is joined to upper partial electrode 811 or 911 by a soldering material (not shown) arranged between the upper partial electrode and the conductive connecting member (and more specifically, by heat-treating (reflowing) a soldering material arranged between the upper partial electrode and conductive connecting member). Consequently, in the light emitting device of the present invention, since there is no damage to the light emitting layer 813-2 or 913-2 by vibrations or pressure as in the case of a light emitting device produced by wire bonding using thermocompression and ultrasonic oscillation, it is not necessary to subtly adjust the pressure and ultrasonic oscillation of the wire bonding machine during production thereof that was necessary in the case of vertical geometry light emitting diodes of conventional light emitting devices.

The metal substrate portions 12 and 14 used in the light emitting device of the present invention can be produced with copper or copper alloy, aluminum or aluminum alloy or iron or iron alloy. The ceramic substrate 22 can be produced with alumina or silicon nitride or the like.

The package electrodes in the form of metal substrate portions 12 and 14 are able to supply electrical power directly to the vertical geometry light emitting diode 11 by connecting to a power supply with wiring. A plating layer (not shown) of at least one type of metal selected from the group consisting of silver, gold and nickel can be formed on the surfaces of the metal substrate portions 12 and 14, thereby enabling light from the light emitting diode to be efficiently radiated to the outside. Since the metal substrate portions 12 and 14 are also good heat conductors, they are also able to act effectively in dissipating heat generated accompanying the supply of electrical power to the light emitting diode. In this manner, in the case of using the metal substrate portions 12 and 14 as package electrodes, three roles can be fulfilled simultaneously, namely the role of an electrical conductor that allows the flow of current, the reflection of light from the vertical geometry light emitting diode (at the regions located inside the opening of the reflector), and the dissipation of heat generated by the diode. Since the entirety of substrate portions 12 and 14 functioning as electrical conductors is used to conduct electricity, they are particularly effective for the flow of large-capacity current.

In the case of using the ceramic substrate 22, it is necessary to form a pair of package electrodes on the surface thereof that are mutually opposed and separated by an insulating portion in order to supply electrical power to the light emitting diode (the package electrodes in the case of a ceramic substrate as are previously explained). If the package electrodes are of a material consisting mainly of gold or silver, and are at least formed on a substrate surface exposed in the opening of the reflector, they can be used to reflect light radiated from the light emitting diode.

The reflector 16 can be produced from, for example, an alumina-based or alumina and glass compound ceramic. The reflector 16 can also be made of a synthetic resin. The reflecting surface 161 of the opening of the reflector 16 can also be coated with a gold, silver or aluminum film or the like to improve reflection efficiency.

Adhesion of the reflector to the metal substrate portions 12 and 14 or the ceramic substrate 22 can be carried out by, for example, using a thermosetting adhesive consisting mainly of a two-pack type of epoxy resin, or using an adhesive composed of a silicone-based resin. In addition, a polyimide resin-based, glass-based or brazing material-based adhesive, for example, can also be used. The adhesive can be easily coated onto an area of small size by, for example, an automated coating machine.

In the light emitting device of the present invention, the metal substrate (comprised of, for example, the two substrate portions 12 and 14 as previously explained), the ceramic substrate 22 and the reflector 16 of the package can have a circular, square, rectangular or oval shape and the like for the shape as viewed from above (shape shown in the plan views of FIGS. 1A, 2C and 3C).

The conductive connecting member 15 has, for example, two arms 151 (FIGS. 1A, 2C and 3C) on the side connected to the upper electrode 111 of the vertical geometry light emitting diode 11. The thickness, shape or number of the arms 151 can be changed. The emission efficiency of the light emitting diode can be improved or thermal stress occurring during generation of heat can be alleviated by making contrivances in the shape of the conductive connecting member 15, and particularly to the shape of the arms 151. For example, the two arms 151 may not be parallel as shown in the drawings, but rather may have a central portion bent horizontally outward or may be bent perpendicularly. In addition, arms 151 can be formed in the shape of a rod or in the shape of a ribbon. Arms 151 can also be formed so as to increase the surface area of the end that connects with the upper electrode 111.

In the case of a plurality of arms 151, an opening can be formed between the adjacent arms, and light radiated from a side portion 114 (FIGS. 2B, 3B and 4) of the vertical geometry light emitting diode 11 is led to the outside through this opening.

A highly conductive metal is used for the material of the conductive connecting member 15, and gold, silver, copper or an alloy thereof is preferable. In the case of a material other than gold, silver or an alloy thereof, plating the surface of the conductive connecting member 15 with gold or silver is preferable since this improves adherence with the solder used for joining while also allowing a larger current flow. Nickel can also be used for the plating material. The conductive connecting member 15 electrically connected to the upper electrode 111 of the light emitting diode 11 via the arms 151 not only allows the flow of large-capacity current as compared with gold wire or other wiring having a diameter of about 25 to 30 µm used in the prior art, but also makes it possible to improve strength and heat dissipation depending on the shape of the cross-section and surface thereof.

The following provides an explanation of variations of the conductive connecting member with reference to FIGS. 6A to 6F.

Figure 6A:
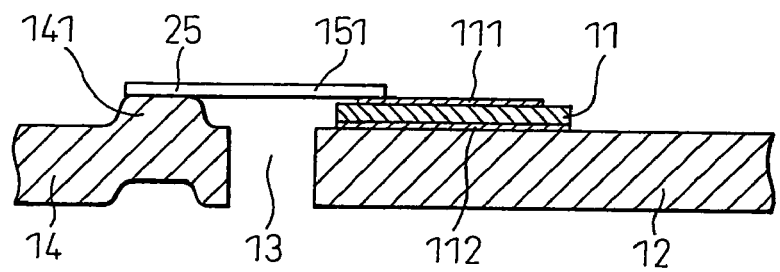
FIGS. 6A to 6F are drawings for explaining various examples of conductive connecting members.

A conductive connecting member 25 shown in FIG. 6A is used in the case the upper electrode 111 of the vertical geometry light emitting diode 11 mounted on one of the package electrodes in the form of the metal substrate portion 12, and a joining portion 141 of the other package electrode in the form of the substrate portion 14, are at the same height. This conductive connecting member 25 is produced in the form of a flat sheet, and the side connected with the upper electrode 111 of the light emitting diode 11 has, for example, the shape of two arms 151 as shown in FIG. 1A. In this case, the joining portion 141 of the substrate portion 14 can be easily formed by pressing a flat metal material so that those portions protrude in the shape of a projection.

Figure 6B:
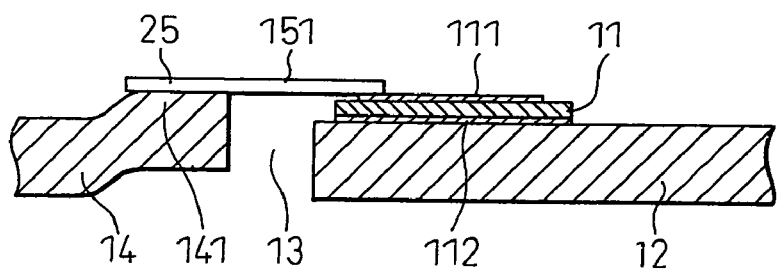

FIG. 6B shows another embodiment of the projecting joining portion 141 formed on the metal substrate portion 14. The joining portion 141 in this drawing can also be easily formed by pressing a flat metal material.

Figure 6C:
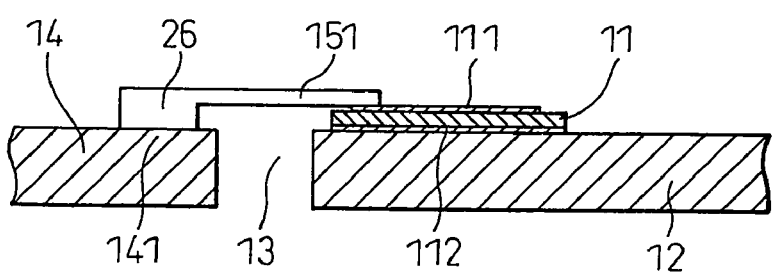

A conductive connecting member 26 shown in FIG. 6C is used in the case the upper electrode 111 of the vertical geometry light emitting diode 11 mounted on one of the package electrodes in the form of substrate portion 12 and the joining portion 141 of the other package electrode in the form of substrate portion 14 have different heights. This connecting member 26 can be produced by, for example, pressing a flat metal sheet, and also has two arms 151 on the side connected with the upper electrode 111 of the light emitting diode 11.

Figure 6D:
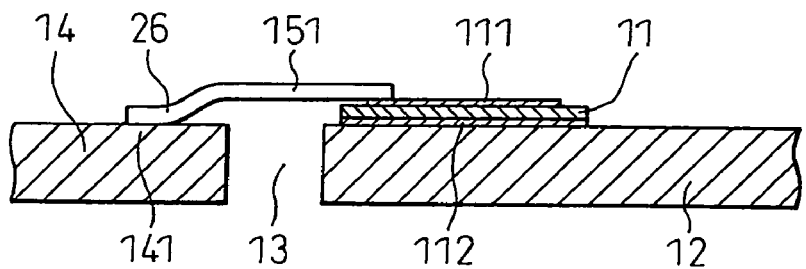

FIG. 6D shows another example of the connecting member 26 used in the case the upper electrode 111 of the vertical geometry light emitting diode 11 and the joining portion 141 of the substrate portion 14 have different heights.

Figure 6E:
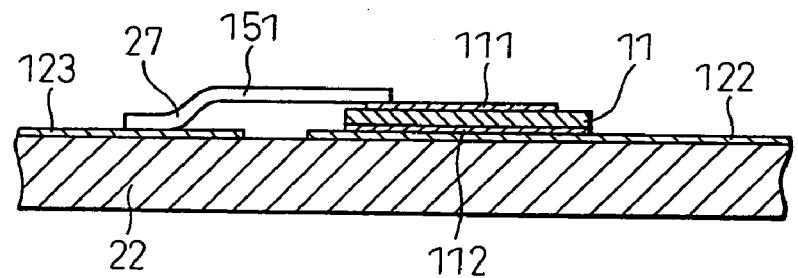

FIG. 6E shows an example of a connection between the upper electrode 111 of the light emitting diode 11 and the package electrode 123 made by a conductive connecting member 27 in the case of using the ceramic substrate 22. The conductive connecting member 27 used in this example is similar to that shown in FIG. 6D.

Figure 6F:
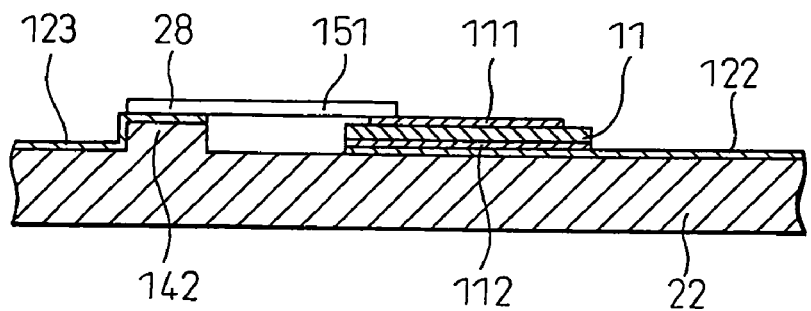

FIG. 6F shows an example of a connection between the upper electrode 111 of the light emitting diode 11 and the package electrode 123 made by a conductive connecting member 28 in the case of using the ceramic substrate 22. The conductive connecting member 28 used in this example is similar to the connecting member 25 shown in FIG. 6A, is produced from a flat sheet and has two arms 151. A projection-like connecting portion 142 is provided on the ceramic substrate 22 so as to be at the same height as the upper electrode 111 of the light emitting diode 11 in order to allow the use of the sheet-like connecting member 27.

The arms can be bent in the horizontal or vertical direction in any of the conductive connecting members shown in FIGS. 6A to 6F.

The conductive connecting member can be easily produced from a metal material. Consequently, the light emitting device of the present invention that uses the conductive connecting member not only allows the flow of large-capacity current (such as current of 350 mA or more) as compared with light emitting devices connected by one or two gold wires, but also enables the dissipation of heat generated thereby from the conductive connecting member.

A ribbon-shaped connecting member may also be used instead of the conductive connecting members 15, 25, 26, 27 or 28 having arms 151. Since a ribbon-shaped connecting member can be easily produced from a metal material, and can easily be connected with other members, it is a preferable connecting member in the present invention.

Figure 7A:
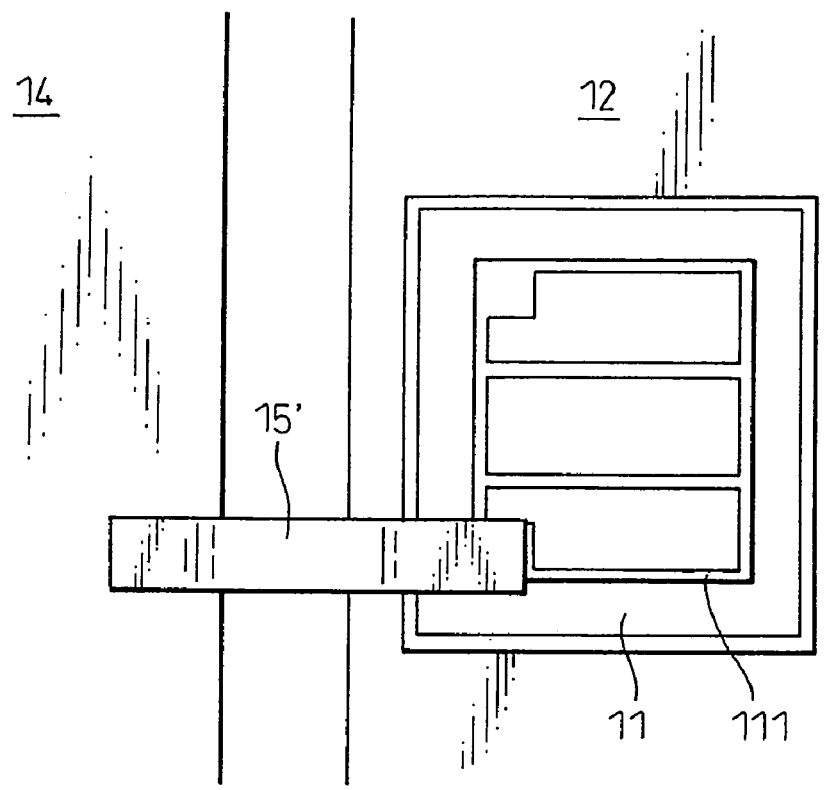
FIGS. 7A and 7B are drawings for explaining a ribbon-shaped connecting member.
Figure 7B:
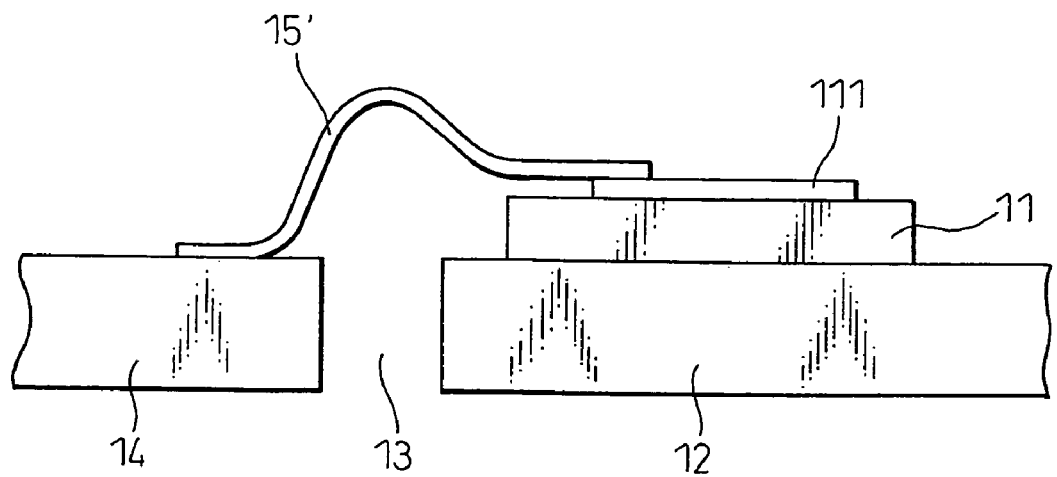

In the case of using a ribbon-shaped connecting member, as is schematically shown in FIG. 7A (plan view) and FIG. 7B (side view), the upper electrode 111 of the vertical geometry light emitting diode 11 mounted on one of the package electrodes (metal substrate portion 12 in the drawings) and the other package electrode (the other substrate portion 14 in the drawings) may be simply connected by a ribbon-shaped connecting member 15'. A preferable ribbon-shaped connecting member is made of gold.

The conductive connecting member used in the light emitting device of the present invention may also have both ends flattened by, for example, pressing a gold wire having a diameter of 50 to 100 µm.

The cross-sectional area of the conductive connecting member through which current flows is preferably at least 1500 to 10000 µm². More preferably, the cross-sectional area of the conductive connecting member through which current flows is at least 2000 to 6000 µm². In the case of a member having two or more arms as typically observed in FIGS. 1A, 2C and 3C, this cross-sectional area is the total of the areas of the cross-sections perpendicular to the direction of length of respective arms, while in the case of a ribbon-shaped connecting member as shown in FIGS. 7A and 7B, is the area of the cross-section perpendicular to the lengthwise direction thereof. For example, in the case of a conductive connecting member in the form of a gold ribbon, the width of the ribbon may be 100 to 200 µm and the thickness may be about 20 to 25 µm.

Figure 8:
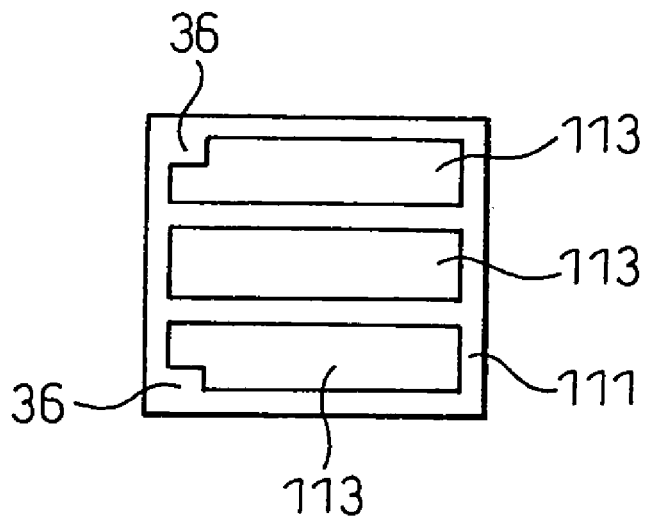
FIG. 8 is a drawing for explaining an upper partial electrode of a vertical geometry light emitting diode.

FIG. 8 is a plan view of a typical upper electrode 111 of a vertical geometry light emitting diode to which is connected a conductive connecting member. A connecting portion 36 having a large surface area is provided on the left side (side connected to the connecting member) of the upper electrode 111 in the drawing. As a result of being made to be of the same size or nearly the same size as the connecting portion of the end of connecting member 15' shown in FIG. 7A for example, the connecting portion 36 of the upper electrode 111 further improves the mutual electrical junction together with limiting the generation of heat when a large current is applied.

The upper electrode 111 of FIG. 8 produced in the form of a partial electrode covering only a portion of the upper surface of the mounted light emitting diode has three parallel rectangular openings 113. The light emitting diode (not shown) efficiently radiates light from the portion other than the partial electrode to the outside. In some cases, the upper electrode 111 may be formed roughly into the shape of the letter U or the letter C.

In the light emitting device of the present invention, the junction between one of the package electrodes and the lower electrode of the vertical geometry light emitting diode, the junction between the upper electrode of the vertical geometry light emitting diode and the conductive connecting member, and the junction between the conductive connecting member and the other package electrode are made by solder. A preferable solder material is eutectic solder. Examples of eutectic solder that can be used include gold-tin-based, tin-silver-copper-based, tin-silver-based and indium-based eutectic solder. Gold-tin-based solder paste and other known solder materials may also be used. Moreover, solder materials other than those listed here can also be used. The strength of a junction made with a solder material can be increased by plating the mutually joined members with gold.

Figure 9:
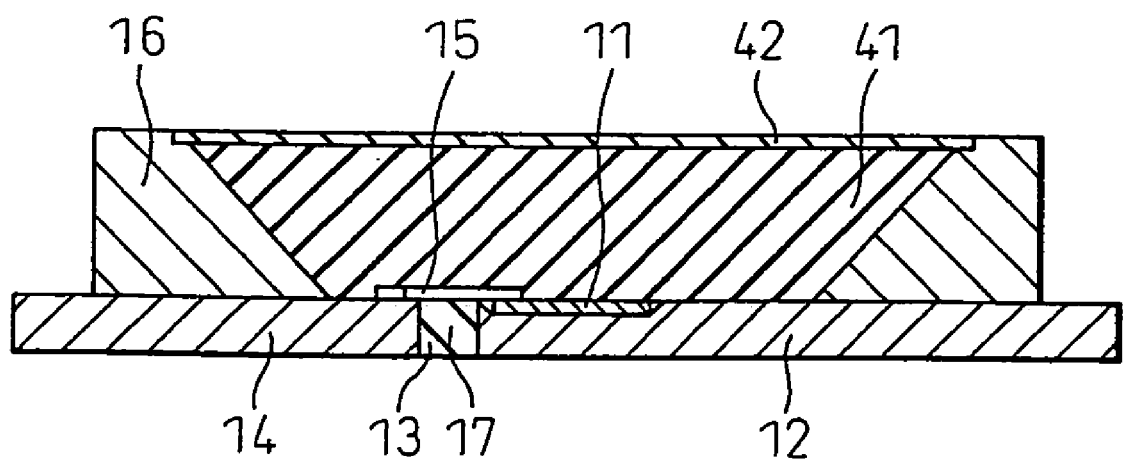
FIG. 9 is a drawing for explaining a light emitting device in which a reflector opening is filled with a sealing material.

In the light emitting device of the present invention, the vertical geometry light emitting diode can be sealed by filling the opening of the reflector with a transparent sealing material as necessary. FIG. 9 shows a light emitting device produced using a package having the metal substrate portions 12 and 14 in which the opening of the reflector 16 is filled with a sealing material 41.

A one-pack or two-pack thermoplastic silicone-based resin or elastomer can be used for the sealing material 41. A silicone sealing material having a Shore A hardness (rubber hardness) of 15 to 85 is preferable for absorbing thermal stress generated when a large current (such as 350 mA or more) flows through the vertical geometry light emitting diode 11 and reducing the stress imparted to the junction between the conductive connecting member 15 and the upper electrode (not shown) of the light emitting diode 11 and to the junction between the conductive connecting member 15 with the substrate portion 14. The silicone sealing material more preferably has a Shore A hardness of 20 to 80.

The rated current that flows through the vertical geometry light emitting diode of the light emitting device of the present invention can be 350 mA or more. In the case of filling the opening of the reflector with a transparent sealing material and in the case the rated current of the light emitting diode is less than 350 mA, it is not necessary to consider the hardness of the sealing resin since there is little generation of heat.

A fluorescent material-containing film 42 capable of converting a color of light radiated from the vertical geometry light emitting diode 111 to a desired color can be provided on the upper portion of the opening of the reflector 16. In the case of having filled the opening of the reflector 16 with the sealing material 41, the fluorescent material-containing film 42 is typically positioned on the surface of the sealing material 41 as shown in FIG. 9. In the case of not using a sealing material, the light emitting diode 11 and the fluorescent material-containing film 42 are separated by a space.

A fluorescent material may also be contained in advance in the sealing material. A sealing material containing a fluorescent material is able to convert light radiated from the front and sides of the vertical geometry light emitting diode to a desired color without providing a fluorescent material-containing film on the surface.

The light emitting device of the present invention can be produced by a method in which a light emitting diode is joined to a package having a plurality of mutually separated package electrodes. A single package for producing a single light emitting device may be used for the package, or a package aggregate for producing an aggregate composed of a plurality of light emitting devices may also be used.

In the production of a light emitting device according to the method of the present invention, the lower electrode of a vertical geometry light emitting diode is first joined to one of the package electrodes of the package provided to thereby mount the vertical geometry light emitting diode on the package. Subsequently, the upper partial electrode of the light emitting diode and the other package electrode are connected using a conductive connecting member.

In the method of the present invention, the junction between one of the package electrodes and the lower electrode, the junction between the upper electrode and the conductive connecting member, and the junction between the conductive connecting member and the other package electrode are made using a solder material. Joining using a solder material can be carried out by causing reflow of a solder material arranged between the two members to be joined. In this manner, in the method of the present invention, a solder material is arranged at three locations, namely between one of the package electrodes and the lower electrode, between the upper electrode and the conductive connecting member, and between the conductive connecting member and the other package electrode. Joining by causing reflow of the solder material can be carried out by first reflowing the solder between one of the package electrodes and the lower electrode to fix and mount the light emitting diode to the package, followed by positioning the solder material between each end of the conductive connecting member and the upper electrode and the other package electrode, arranging the conductive connecting member at a prescribed position, and joining the conductive connecting member to the upper electrode and the other package electrode by reflowing the solder material at these two locations. Alternatively, the solder material may be arranged at the three locations and then reflowed all at once. Reflowing the solder at three locations all at once is more preferable since it enables the production process to be simplified.

Figure 10A:
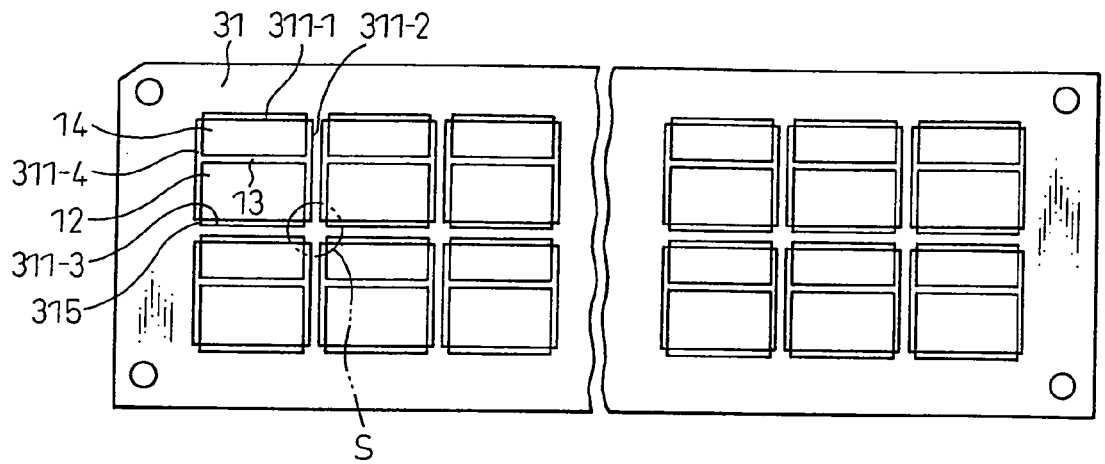
FIGS. 10A and 10B are drawings for schematically explaining a package aggregate used to produce a light emitting device of the present invention.

FIG. 10A shows an example of a metal substrate for producing a package aggregate that can be used to produce a light emitting device of the present invention. A package aggregate comprised of two rows of packages is produced on a metal substrate 31 shown in this drawing. A single package is comprised of package electrodes in the form of the substrate portions 12 and 14. The substrate portions 12 and 14 are separated by the slit (internal slit) 13. On the other hand, the periphery of the package composed of the substrate portions 12 and 14 is surrounded by peripheral slits 311-1, 311-2, 311-3 and 311-4. The peripheral slits 311-2 and 311-4 communicate with the internal slit 13.

Figure 11A:
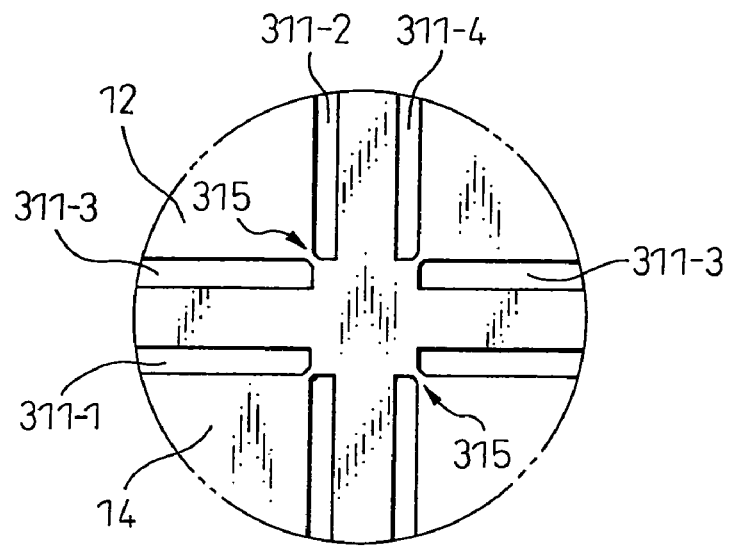
FIGS. 11A and 11B are schematic drawings for explaining peripheral slits in respective packages used to produce a light emitting device of the present invention.
Figure 11B:
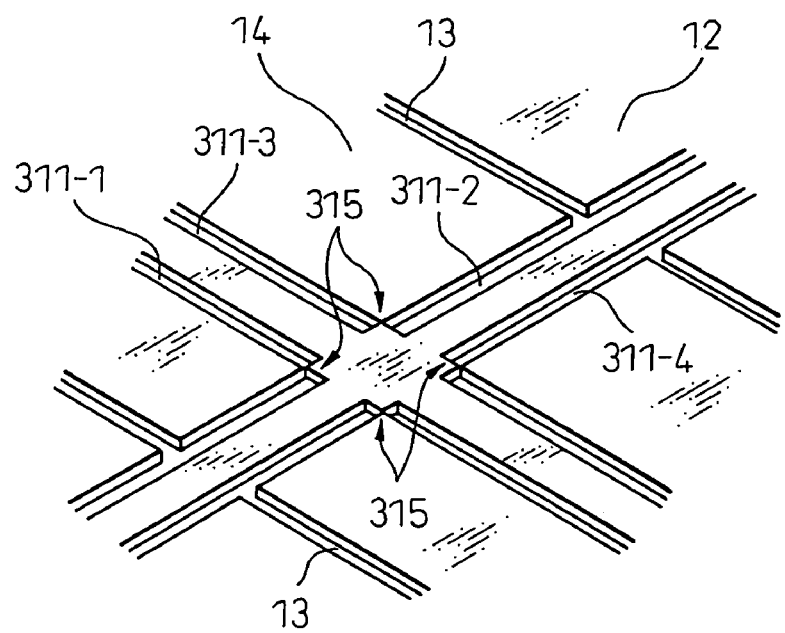

As shown in FIGS. 11A (enlarged view of section S of FIG. 10A) and 11B, the peripheral slits 311-1, 311-2, 311-3 and 311-4 are interrupted by minute links (weakened portions) 315 between the ends of adjacent peripheral slits. As a result, the metal substrate 31 (FIG. 10A) is comprised of the substrate portions 12 and 14 separated by the internal slit 13, and the integrity of a single package surrounded by the peripheral slits 311-1, 311-2, 311-3 and 311-4 is maintained.

The internal slit 13 may also be filled in advance with the insulating material 17 (FIGS. 2A to 2C). The insulating material 17 preferably has high elasticity and adhesion in the manner of an epoxy-based resin. An insulating material filled into the internal slit 13 is able to electrically insulate the substrate portions 12 and 14 while also fulfilling the role of maintaining the integrity of the package comprised of the substrate portions 12 and 14.

Figure 10B:
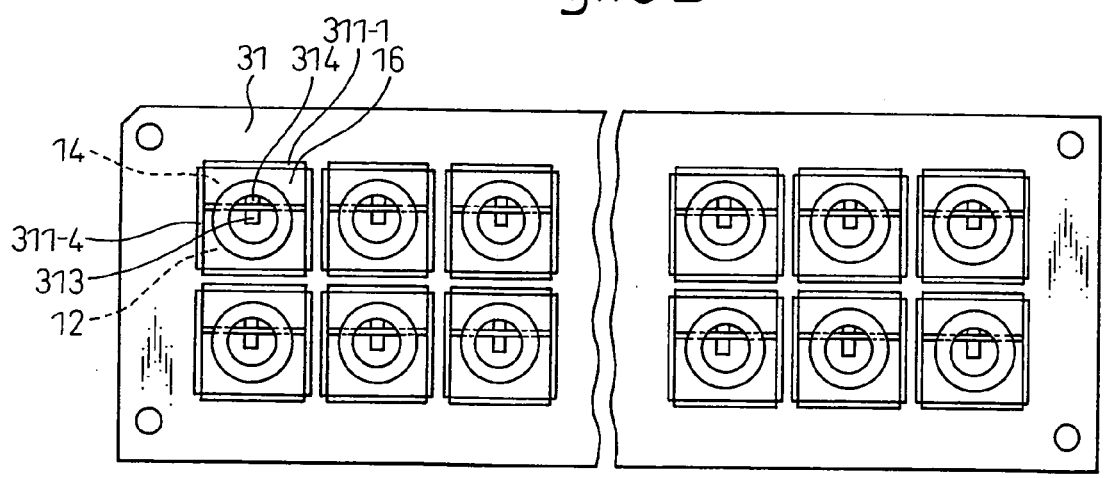

As shown in FIG. 10B, the reflector 16 can be mounted on each package by adhering thereto. The light emitting diode (not shown) is preferably positioned in the center of the reflector opening so that light from the light emitting diode can be efficiently reflected by the reflector 16. Consequently, the slit (internal slit) 13 that separates the package electrodes in the package is offset from the center of the opening of the reflector 16. In FIG. 10B, the mounting position of the light emitting diode on one of the substrate portions 12 is schematically indicated with reference symbol 313, while the joining position of the conductive connecting member connected to the upper electrode of the light emitting diode on the other substrate portion 14 is schematically indicated with reference symbol 314, and the slit (internal slit) 13 can be seen to be offset from the center of the opening of the reflector 16 so that the light emitting diode mounting position indicated with reference symbol 313 is located in the center of the opening of the reflector 16.

The outer periphery of the reflector 16 may coincide with the outer periphery of the package comprised of the substrate portions 12 and 14, or it can be positioned to the inside of the outer periphery of the package. In some cases, the outer periphery of the reflector 16 can have a portion thereof coinciding with the outer periphery of the package, while the remainder can be positioned to the inside of the outer periphery of the package. FIG. 10B shows the reflector 16 with the outer periphery thereof coinciding with the outer periphery of the package. As a result of being joined to the substrate portions 12 and 14 with adhesive, the reflector 16 improves the emission efficiency of the light emitting device by reflecting light radiated from the light emitting diode, while also contributing to maintaining the integrity of the package.

Mounting of the reflector 16 to the package by adhesion may be carried out before or after the mounting of the light emitting diode and conductive connecting member to the package as described below.

The light emitting diode (not shown) is mounted by joining the lower electrode at light emitting diode mounting position 313 of one of the package electrodes in the form of the substrate portion 12 shown in FIG. 10B, and the upper electrode of the light emitting diode is connected to the other package electrode in the form of substrate portion 14 via the conductive connecting member (not shown) joined at the conductive connecting member joining position 314 of the substrate portion 14, thereby completing the light emitting device. Joining of the lower electrode of the light emitting diode with the substrate portion 12, and joining of the conductive connecting member with the upper partial electrode of the light emitting diode and the substrate portion 14 are carried out by reflowing a solder material. Joining of the lower electrode of the light emitting diode with the substrate portion 12, and joining of the conductive connecting member with the upper electrode of the light emitting diode and the substrate portion 14 may be carried out simultaneously or the former joining can be carried out first followed by carrying out the latter joining.

Since a light emitting device completed by using a package aggregate is only connected to the metal substrate 31 by the minute links 315 formed in the form of weakened portions between the peripheral slits, it can easily be separated from the metal substrate 31 with only a slight pressing force. In some cases, an aggregate of a plurality of light emitting devices can also be produced by using a metal substrate on which peripheral slits have been formed that collectively surround a plurality of packages. Moreover, a single light emitting device or an aggregate of a plurality of light emitting devices can also be produced according to a procedure in which a light emitting diode is mounted on a single package or an aggregate of a plurality of packages separated from the metal substrate after having mounted the reflector 16.

Figure 12A:
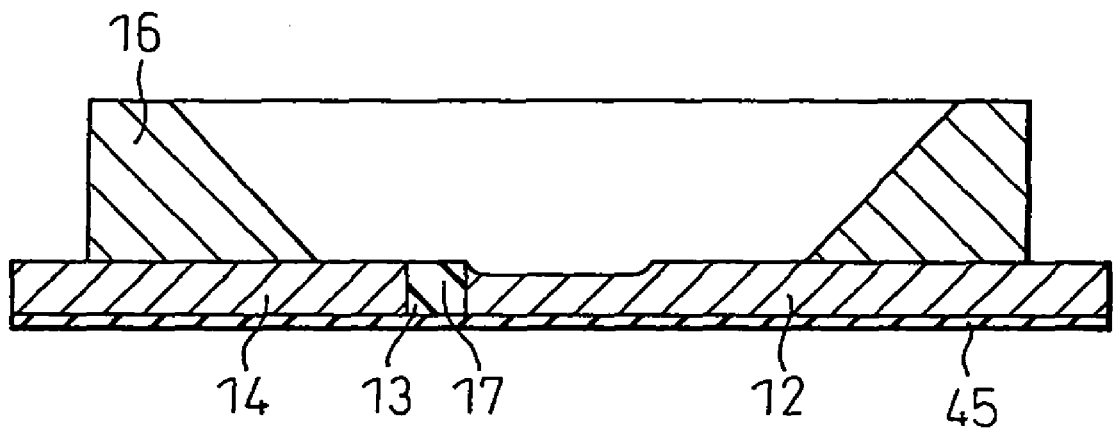
Figure 12B:
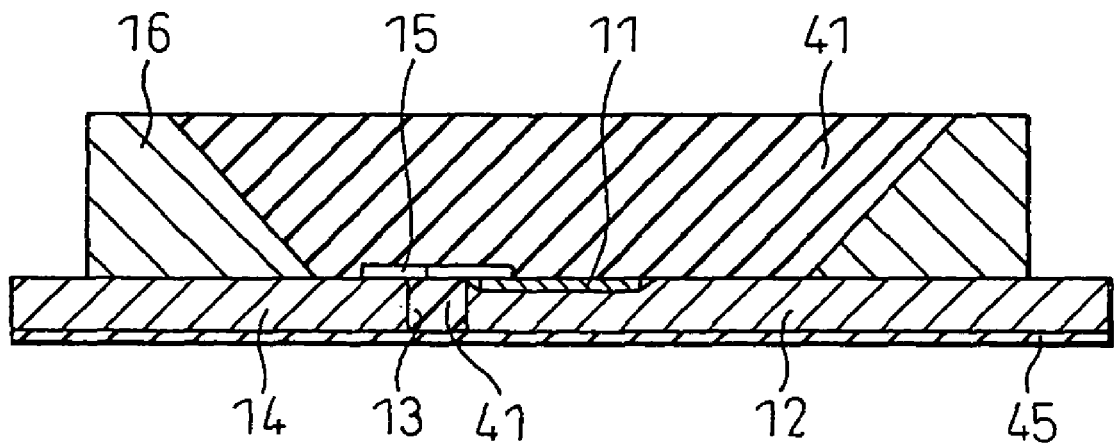
FIG. 12B is a drawing for explaining the filling of a sealing material into a reflector opening.

The following provides an explanation of examples of filling a slit that separates metal substrate portions with an insulating material and filling a reflector opening with a sealing material with reference to FIGS. 12A and 12B.

In the case of filling the slit with an insulating material, as shown in FIG. 12A, a film 45 able to be peeled off later is adhered to the back side of a package in which the reflector 16 is adhered to the substrate portions 12 and 14. Subsequently, the film 45 is peeled off after filling the slit 13 separating the substrate portions 12 and 14 with the insulating material 17 (such as an epoxy-based resin). Filling the slit 13 with the insulating material 17 may also be carried out before mounting the reflector 16.

In the case of filling the reflector opening with the sealing material, as shown in FIG. 12B, the film 45 able to be peeled off later is adhered to the back side of a package mounted with the reflector 16 and the light emitting diode 11. Subsequently, the film 45 is peeled off after filling the slit 13 separating the substrate portions 12 and 14 and the opening of the reflector 16 with the sealing material 41. In the case of filling the slit 13 with the insulating material 17 in advance (FIG. 12A), the opening of the reflector 16 can be filled with the sealing material 19 without adhering the film 45 to the back side of the package.

In the case a fluorescent material-containing film is required, the fluorescent material-containing film can be provided covering the surface of the sealing material filled into the opening of the reflector 16.

Figure 13:
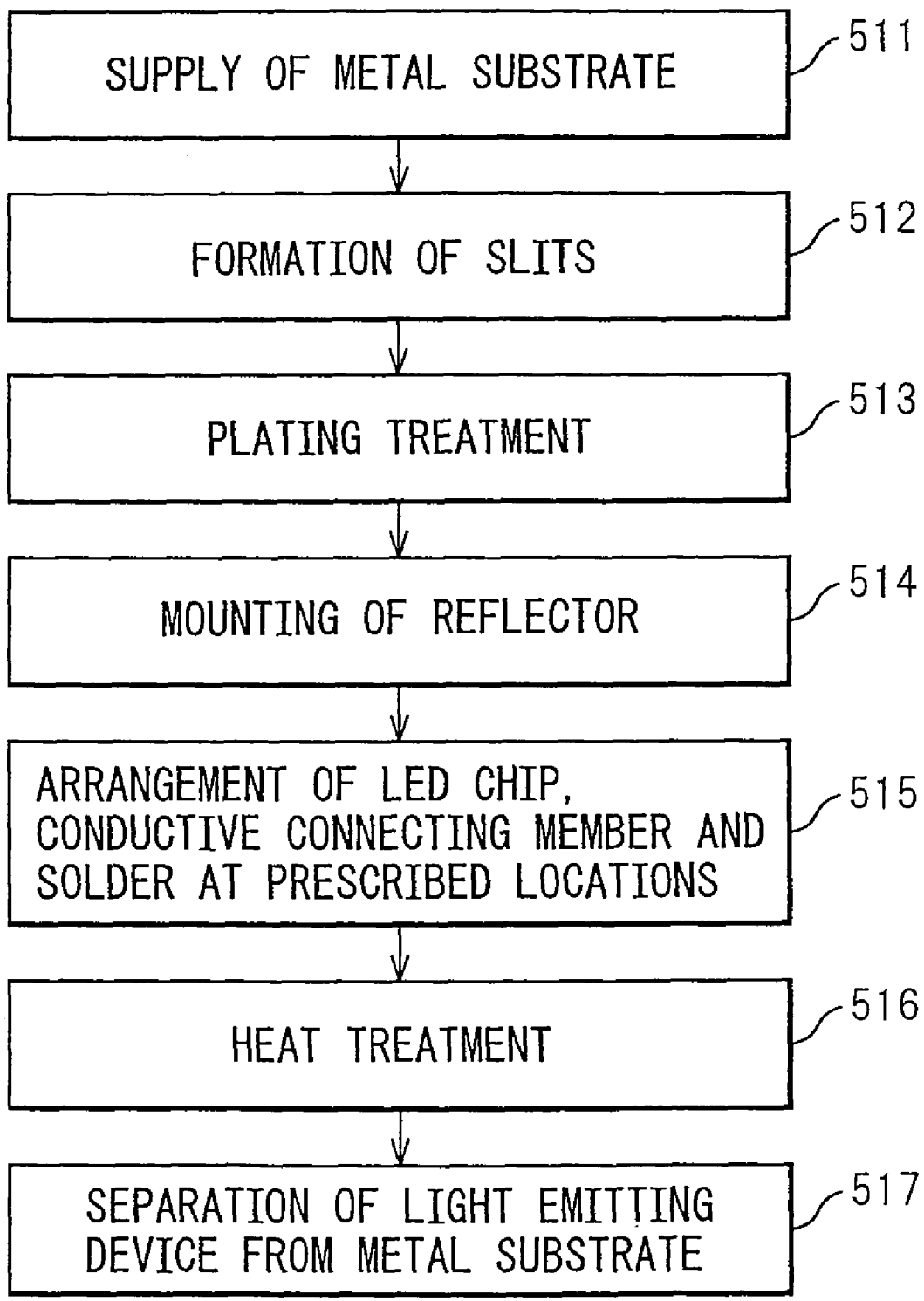
FIG. 13 is a flow chart for explaining an example of a light emitting device production method of the present invention.

FIG. 13 shows a flow chart for explaining an example of a method for producing the light emitting device according to the present invention using a package produced on a metal substrate. First, a strip-like metal substrate is supplied by transporting it on a base, for example, so as to enable continuous processing (Step 511). Slits and the like are formed corresponding to the position where the vertical geometry light emitting diode is mounted (Step 512). A gold or silver plating layer is then formed inside the region of the substrate portions (Step 513). The reflector is mounted at a prescribed location by adhering thereto (Step 514). A solder material is arranged at a prescribed location of one of the substrate portions, the vertical geometry light emitting diode is arranged thereon by contacting the lower electrode, and a solder material is arranged at prescribed locations of the upper electrode of the vertical geometry light emitting diode and the other substrate portion, followed by arranging the conductive connecting member so that both ends thereof are in contact with the solder material (Step 515). The metal substrate is then subjected to heat treatment by passing through a reflow oven, thereby joining each of the members with the solder (Step 516). Subsequently, a single light emitting device or an aggregate of a plurality of light emitting devices are separated from the metal substrate (Step 517). In this manner, the light emitting device production method according to the present invention is carried out on a line consisting primarily of a press machine and an electronic component mounting robot. A single light emitting device can also be produced or a prescribed number of light emitting devices can be produced in aggregate units.

In the case of producing a light emitting device with a package using a ceramic substrate, light emitting devices can be basically produced in the same manner as in the case of a metal substrate package with the exception that package electrodes are formed from a conductor material at prescribed locations on the ceramic substrate by, for example, paste printing or plating instead of forming substrate portions to serve as package electrodes separated by a slit as in the case of a metal substrate package, and that it is not necessary to form a gold or silver plating layer for reflection in the case the conductor material of the package electrodes is gold or silver and package electrodes are formed on the substrate surface at locations other than those locations required for electrical connections between members.

Figure 14A:
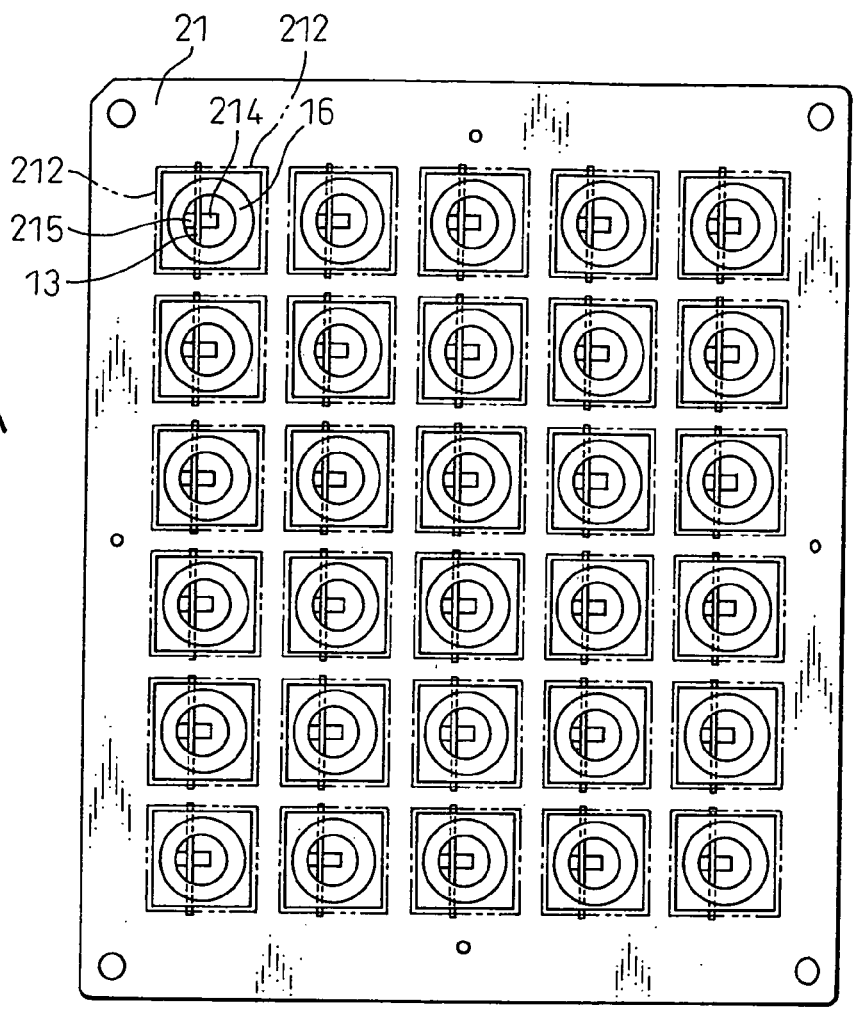
FIGS. 14A and 14B are schematic drawings for explaining another example of a package aggregate capable of being used to produce a light emitting device of the present invention.
Figure 14B:
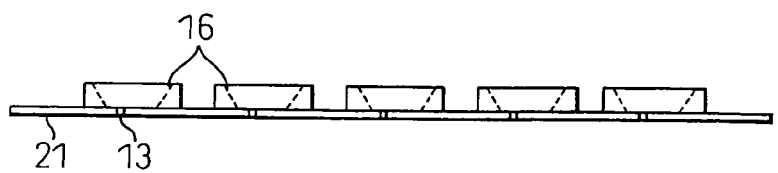

FIGS. 14A and 14B are a plan view and side view, respectively, for explaining another example of a package aggregate capable of being used to produce a light emitting device of the present invention In an aggregate of packages arranged in the form of a matrix on a single metal substrate 21 shown in FIGS. 14A and 14B, the position of the slit 13 of each individual package is offset from the center of the opening of the reflector 16. In FIG. 14A, the mounting position of the vertical geometry light emitting diode on one of the substrate portions of each package is schematically indicated by reference symbol 214, while the joining position of the conductive connecting member with the other substrate portion is schematically indicated by reference symbol 215.

In the package aggregates of FIGS. 14A and 14B, after mounting the vertical geometry light emitting diode and conductive connecting member (not shown) on each package, each package is separated by cutting the metal substrate 21 along a cutting line 212. The slit 13 is formed so as to extend to the cutting line 212 or to a position to the outside thereof so that the two substrate portions of the package are mutually separated by cutting the metal substrate 21. Cutting can be carried out by, for example, a cutter or by pressing with a metal die, and the packages can be cut individually, in rows or simultaneously all at once.

Package separation can also be carried out by cutting along cutting lines provided around the periphery thereof in the case of an aggregate of packages using ceramic substrates, and this cutting can again be carried out by using a cutter or pressing with a metal die. Alternatively, package separation can be facilitated by using a ceramic substrate obtained by baking a green sheet in which a plurality of cracks, a plurality of dots or linear slits or recesses have been provided. Furthermore, the recesses or projections of a ceramic substrate used to mount the vertical geometry light emitting diode or to join the conductive connecting member can also be provided from the green sheet stage.

As has been previously described, the light emitting device of the present invention can adopt the form of a single light emitting device corresponding to a single package, or the form of an aggregate of a plurality of light emitting devices corresponding to an aggregate of a plurality of packages. Examples of single light emitting devices are shown in FIGS. 1A to 1C, 2A to 2C and 3A to 3C.

Figure 15:
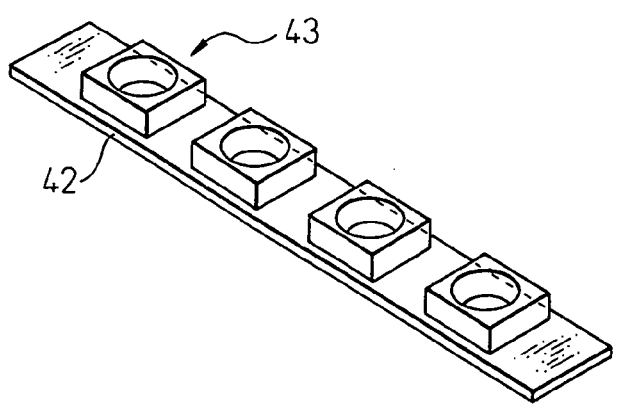
FIG. 15 is a drawing showing an example of an aggregate of light emitting devices according to the present invention.

An example of an aggregate of a plurality of light emitting devices is shown in FIG. 15. Four light emitting devices 43 are connected in series in the light emitting device aggregate of this drawing produced using a ceramic substrate 42. This aggregate measures, for example, about 3 mm wide and about 20 mm long, and can be used as a linear light source, for a waveguide of a liquid crystal display device, or as a wide light emitting device for backlighting an advertisement display apparatus and the like.

Alternatively, a light emitting device aggregate can be obtained measuring, for example, about 10 mm×10 mm in which the light emitting devices are arranged in the form of a matrix, and can be used as a planar light source or for backlighting an advertisement display device and the like.

In the present invention, the number of package electrodes of the light emitting device is not limited to two, but rather a light emitting device is also possible that has three or more package electrodes. The light emitting device of the present invention can contain a prescribed number of vertical geometry light emitting diodes corresponding to the number of package electrodes. More specifically, a light emitting device having n package electrodes can contain n−1 vertical geometry light emitting diodes (where, n=1, 2, 3, . . . ). In the case the number n of package electrodes in a light emitting device is large, the number of vertical geometry light emitting diodes can be fewer than n−1.

Figure 16A:
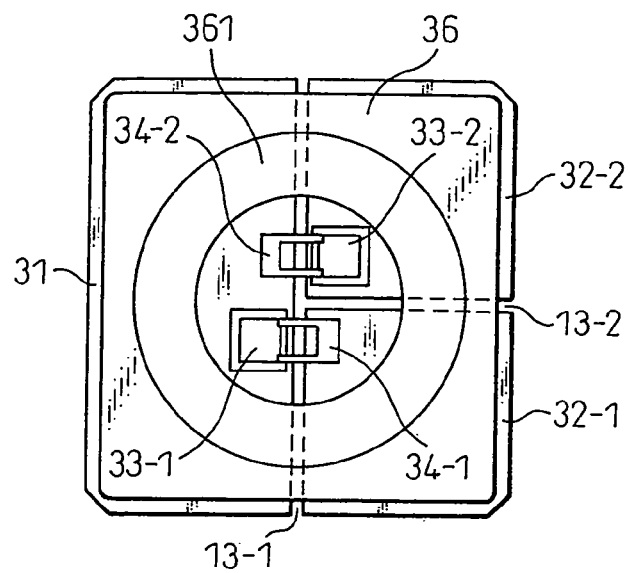
FIGS. 16A to 16D are schematic drawings for explaining a light emitting device of the present invention mounted with two light emitting diodes.
Figure 16B:
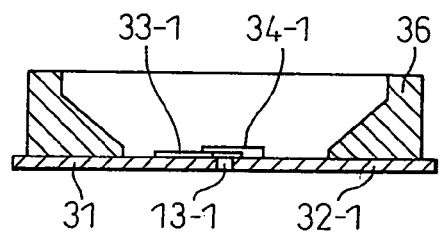
Figure 16C:
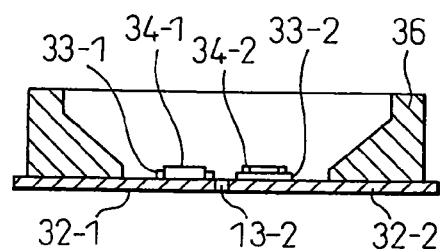
Figure 16D:
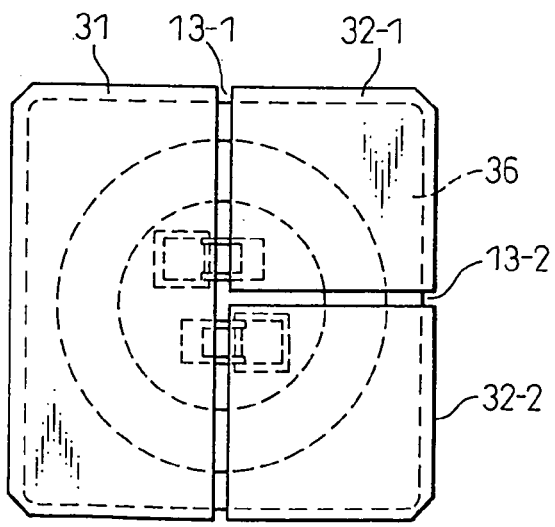

FIGS. 16A to 16D show an example of a light emitting device in which the number of package electrodes is three and the number of light emitting diodes is 2, with FIG. 16A being a plan view of the light emitting diode, FIGS. 16B and 16C being cross-sectional views, and FIG. 16D being a bottom view. The packages used in the light emitting device of this example are produced from a metal substrate (in which the substrate portions separated by slits are equivalent to the package electrodes), and are comprised of a nearly rectangular substrate portion 31, and two nearly square substrate portions 32-1 and 32-2, with adjacent substrate portions being mutually insulated by slits 13-1 and 13-2 provided therebetween.

A lower electrode (not shown) of one vertical geometry light emitting diode 33-1 is joined with solder to the substrate portion 31. The upper partial electrode of the vertical geometry light emitting diode 33-1 is joined to the substrate portion 32-1 via a conductive connecting member 34-1. In addition, the lower electrode of the other vertical geometry light emitting diode 33-2 is joined to the substrate portion 32-2. The upper partial electrode of the vertical geometry light emitting diode 33-2 is joined to the substrate portion 31 via a conductive connecting member 34-2. Thus, the vertical geometry light emitting diodes 33-1 and 33-2 can be connected in series or in parallel.

In the light emitting device shown in FIGS. 16A to 16D, the two vertical geometry light emitting diodes 33-1 and 33-2 are arranged so that the centers thereof are on either diagonal line of a quadrangle composed by the three substrate portions 31, 32-1 and 32-2. As a result of employing this configuration, light from the two vertical geometry light emitting diodes 33-1 and 33-2 of this light emitting device is efficiently radiated forward by a reflecting surface 361 of a reflector 36 and by the surfaces of the substrate portions 31, 32-1 and 32-2.

Figure 17A:
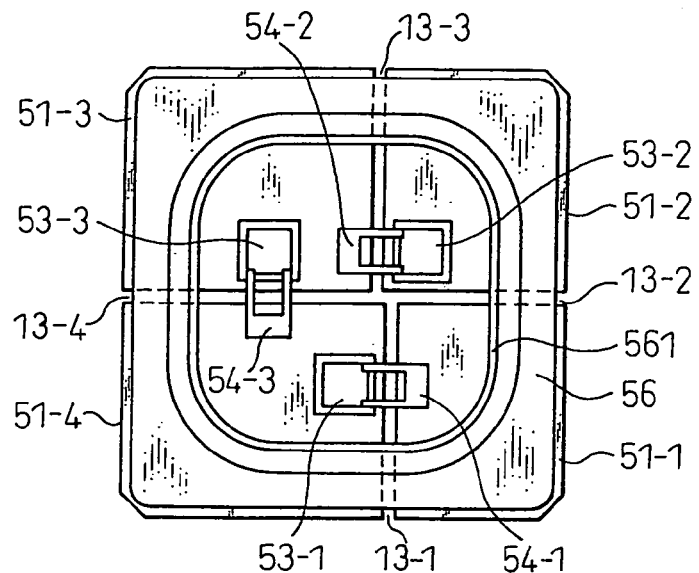
FIGS. 17A to 17D are schematic drawings for explaining a light emitting device of the present invention mounted with three light emitting diodes.
Figure 17B:
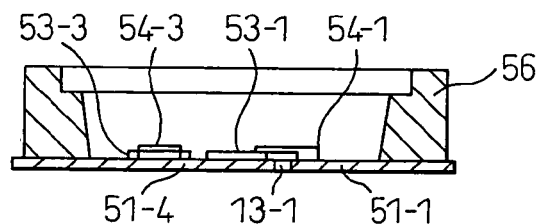
Figure 17C:
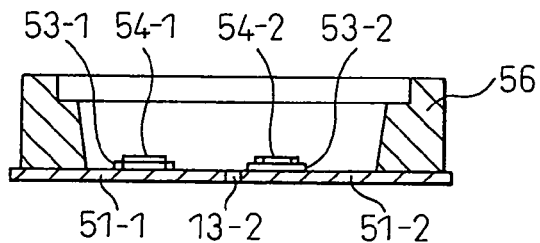
Figure 17D:
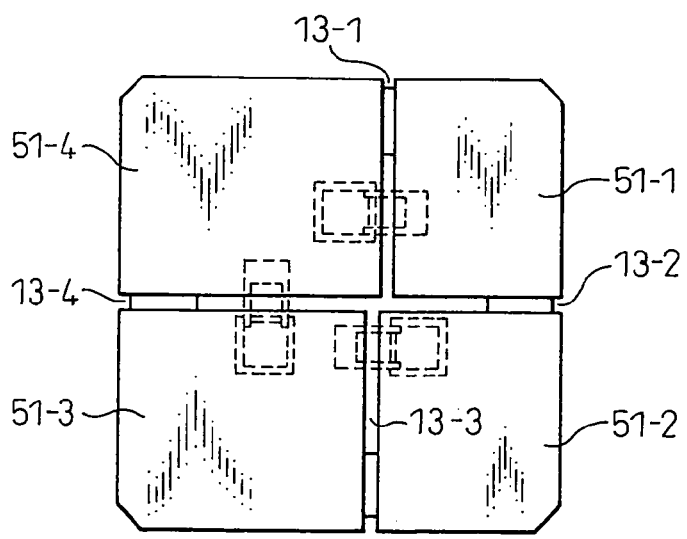
Figure 18A:
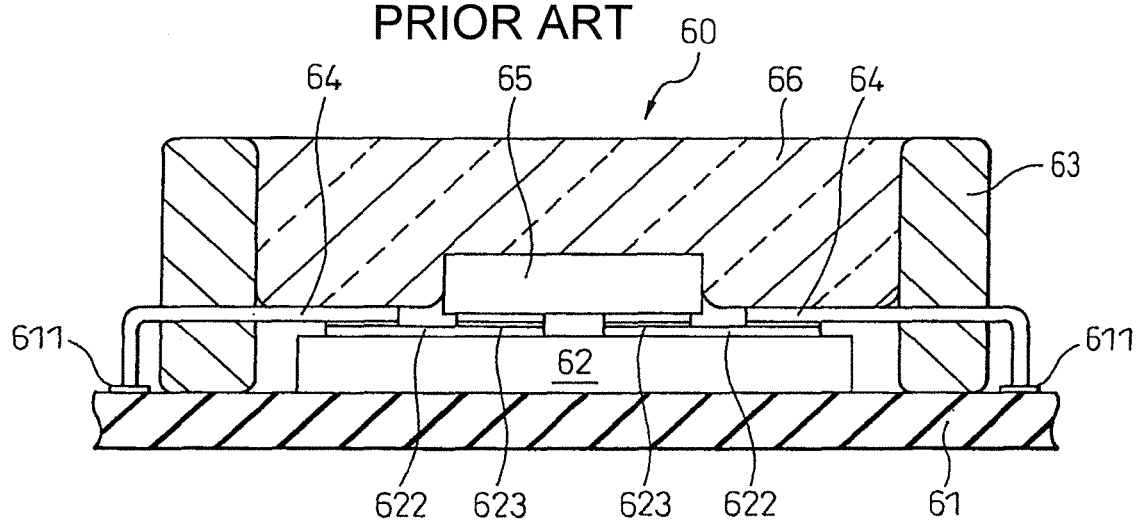
FIGS. 18A and 18B are drawings for explaining a light emitting device of the prior art that uses a submounted type of flip chip light emitting diode.
Figure 18B:
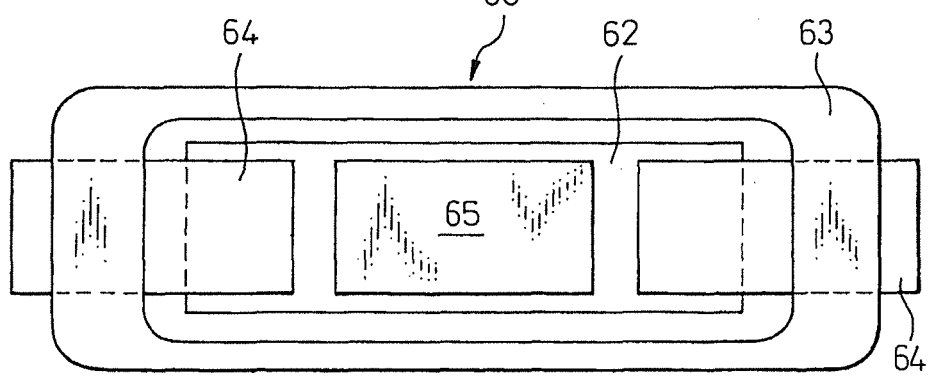
Figure 19A:
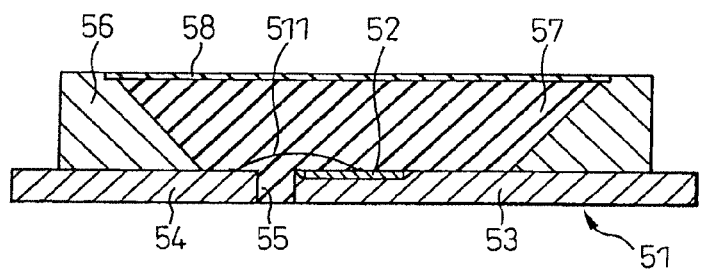
Figure 19B:
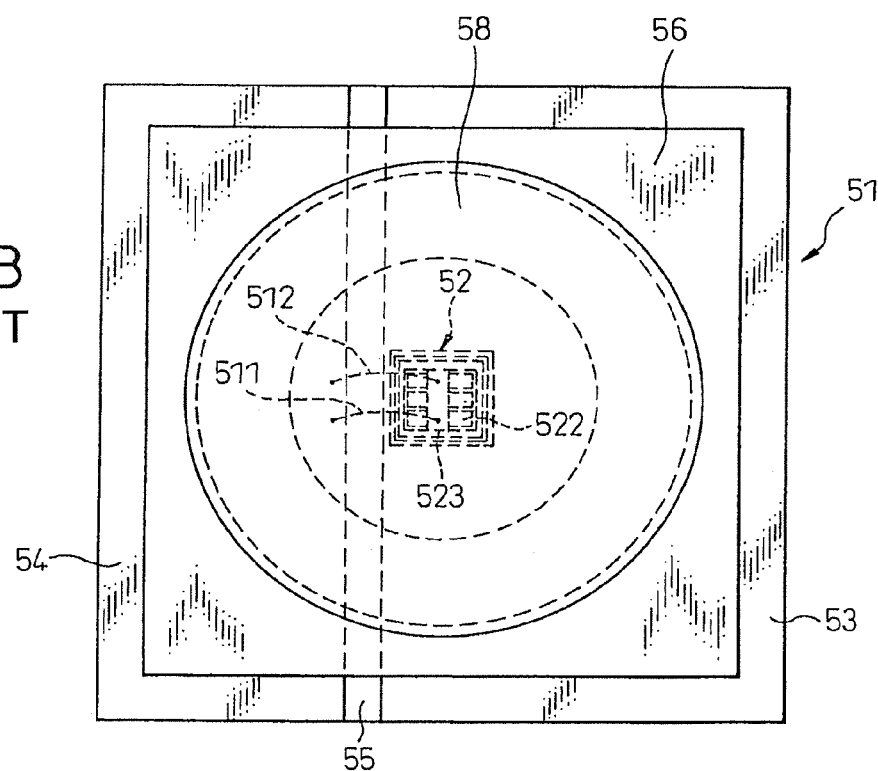
Figure 19C:
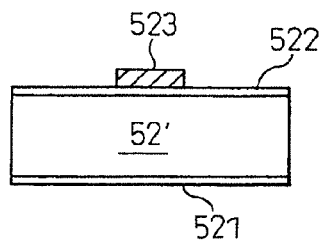
FIG. 19C is a drawing for schematically explaining the vertical geometry light emitting diode used therein.

FIGS. 17A to 17D show an example of a light emitting device in which the number of package electrodes is four and the number of light emitting diodes is three, with FIG. 17A being a plan view of the light emitting device, FIGS. 17B and 17C being cross-sectional views, and FIG. 17D being a bottom view. The packages used in the light emitting device of this example are again produced from a metal substrate, are composed of four quadrangular substrate portions 51-1, 5.1-2, 51-3 and 51-4 of different sizes, and adjacent substrate portions are mutually insulated by slits 13-1, 13-2, 13-3 and 13-4 provided therebetween.

The lower electrode (not shown) of one vertical geometry light emitting diode 53-1 is joined to the substrate portion 51-4. The upper partial electrode of the vertical geometry light emitting diode 53-1 is joined to the substrate portion 51-1 via a conductive connecting member 54-1. Similarly, the lower electrode of a different vertical geometry light emitting diode 53-2 is joined to the substrate portion 51-2. The upper partial electrode of the vertical geometry light emitting diode 53-2 is connected to the substrate portion 51-3 via a conductive connecting member 54-2. Moreover, the lower electrode of another vertical geometry light emitting diode 53-3 is joined to the substrate portion 51-3. The upper partial electrode of the vertical geometry light emitting diode 53-3 is connected to the substrate portion 51-4 via a conductive connecting member 54-3. Thus, the vertical geometry light emitting diodes 53-2, 53-3 and 53-1 are connected in series.

In the light emitting device shown in FIGS. 17A to 17D, the three vertical geometry light emitting diodes 53-1, 53-2 and 53-3 are arranged so that the centers thereof are on a circle having for a center thereof the center of a quadrangle composed by the four substrate portions, and so as to be positioned at equal intervals. As a result of employing this configuration, light from the three vertical geometry light emitting diodes 53-1, 53-2 and 53-3 of the light emitting device is efficiently radiated towards the front by a reflecting surface 561 of a reflector 56 and by the surfaces of the substrate portions 51-1, 51-2, 51-3 and 51-4.

The reflector in the light emitting device of the present invention preferably has a circular opening (such as that shown in FIG. 16A) in the case of one or two vertical geometry light emitting diodes in the light emitting devices or in the case of three light emitting diodes or more, preferably has a nearly rectangular shape (such as that shown in FIG. 17A). As the number of light emitting diodes of a single light emitting device increases, it is advantageous to make shape of the reflecting portion (opening) of the reflector rectangular rather than circular so as to have a higher space factor.

A light emitting device having three or more package electrodes (and two or more light emitting diodes) as shown in FIGS. 16A to 16D and FIGS. 17A to 17D can be produced according to the previously explained method with the exception of using a package in which the required number of electrodes is three or more.

In the light emitting devices shown in FIGS. 16A to 16D and FIGS. 17A to 17D, the light emitting diodes are connected in series. However, in the light emitting device of the present invention in which a plurality of light emitting diodes are mounted on a package, the light emitting diodes may also be connected in parallel. In some cases, it is also possible to use light emitting diodes connected in series and light emitting diodes connected in parallel in a single light emitting device. For example, in a light emitting device incorporating four light emitting diodes, two sets of two light emitting diodes connected in series can be connected in parallel.

The following provides a comparison between a light emitting device according to the present invention produced by connecting a conductive connecting member (gold ribbon having a width of 200 μm and thickness of 25 μm) to an LED (gallium nitride-based vertical geometry light emitting diode emitting blue light at a wavelength of 450 μm, SemiLEDs Corp.) with solder, and a light emitting device produced according to the prior art by connecting gold wires to the same LED by ultrasonic wire bonding.

In the case of the present invention, the LED was arranged in the center of the package on one of the substrate portions (package electrodes) by means of gold-tin (22%) solder paste. Next, the solder paste was applied at a predetermined location of the upper electrode of the LED and at a location for joining the other substrate portion (package electrode) followed by arranging a gold ribbon by contacting its ends thereto. The package aggregate was placed in a heating device at about 300° C. and then cooled after melting the solder to join each member and produce a light emitting device that emits blue light. (A package emitting white light can also be produced by mounting a fluorescent material-containing film on the upper portion of the reflector opening of the produced light emitting device, or various colors of emitted light can be obtained by combining various types of fluorescent material.) There was no occurrence of defects in the joining step of the production process and when the completed light emitting device was subjected to operation life tests at 350 to 500 mA.

In the case of the comparative example of the prior art, two gold wires having a diameter of 30 μm were connected to the upper electrode of the LED by ultrasonic wire bonding. In this case, devices having defective light emission occurred at the rate of about 10% due to ultrasonic oscillation of the wire bonding. Moreover, about 4% of the produced light emitting devices burned out due to abnormal conducting when subjected to current of 350 mA.

In addition, in a long-term on-off conducting test (consisting of switching on and off in 30 second cycles for 100 hours), although defective products attributable to the growth of microcracks occurred in the case of light emitting devices according to the prior art at a rate of 10 to 15%, there was no occurrence of defective products in the case of light emitting devices according to the present invention.

The following provides a comparison between the tensile strength of the gold wire (prior art) and gold ribbon (present invention) used. Gold wire or gold ribbon joining the upper electrode of the vertical geometry light emitting diode with the substrate portion was pulled in the center after which the pulling force was gradually increased. In a tensile test on a single gold wire having a diameter of 30 μm, the gold wire broke in the vicinity of the joining portion when the pulling force was 11 g. In this case, the weak point was determined to be present in the vicinity of the joining portion. When the diameter of the gold wire was decreased to 25 μm, the gold wire again broke in the vicinity of the joining portion when the pulling force in the tensile test was 7 g. In the case of gold ribbon (having a width of 200 μm and thickness of 25 μm), the gold ribbon broke at the pulled portion when the pulling force was 100 to 150 g.

As is clear from the above, the light emitting device according to the present invention has the characteristics indicated below.

(1) Since the conductive connecting member connected to the light emitting diode can be joined with a solder material instead of wire bonding, a conductive member having a large cross-sectional area can be used.

(2) Since the conductive member is connected with solder, there is little variation in bonding strength (for example, in the case of having used a gold ribbon for the connecting member, the gold ribbon itself breaks instead of breaking in the vicinity of a joining portion in a tensile test).

(3) Since a conductive connecting member having a large cross-sectional area is used, the light emitting device is resistant to vibrations and reinforcement with a sealing material can be omitted.

(4) Differing from connections made by ultrasonic wire bonding, ultrasonic oscillation and pressure are not applied during connection of the conductive member, thereby nearly completely eliminating the occurrence of defective products during production and resulting in satisfactory productivity.

Although the above has provided a detailed description of various examples of the present invention, the present invention is not limited thereto. The present invention can be modified in various ways without departing from those matters described in the claims. For example, a known material can be used for the material of the reflector and reflecting film provided thereon in the present invention. A known adhesive can also be used for the adhesive for mounting the reflector to the metal substrate.

The invention claimed is:

1. A light emitting device comprising:
a package having a plurality of mutually separated package electrodes;
a vertical geometry light emitting diode having a light emitting layer positioned between a p-type semiconductor layer and an n-type semiconductor layer, an upper partial electrode of an uppermost layer, and a lower electrode of a lowermost layer, wherein the lower electrode is joined onto one of the package electrodes; and,
a conductive connecting member that connects the upper electrode of the vertical geometry light emitting diode with another one of the package electrodes,
wherein a junction between said one of the package electrodes and the lower electrode, a junction between the upper electrode and the conductive connecting member, and a junction between the conductive connecting member and said other of the package electrodes are made with solder, wherein the package is comprised of a metal substrate having mutually separated substrate portions serving as a plurality of package electrodes and a reflector joined to the metal substrate, and wherein the plurality of substrate portions are held together with the reflector.

2. The light emitting device according to claim 1, wherein the reflector has an opening that surrounds the vertical geometry light emitting diode, the lower electrode of which is joined to said one of the package electrodes, and the opening is filled with a transparent sealing material.

3. The light emitting device according to claim 1, wherein the reflector is comprised of an alumina-based or alumina and glass compound ceramic member, and is joined to the electrode portion by a resin-based, glass-based or brazing material-based adhesive.

4. The light emitting device according to claim 2, wherein the transparent sealing material is comprised of a resin or elastomer having a Shore A hardness of 15 to 85 and preferably 20 to 80.

5. The light emitting device according to claim 4, wherein the transparent sealing material is a one-pack or two-pack type of thermosetting silicone-based resin or elastomer.

6. The light emitting device according to claim 2, further comprising a fluorescent material-containing film on the upper portion of the reflector opening.

7. The light emitting device according to claim 3, further comprising a fluorescent material-containing film on the upper portion of the reflector opening.

8. The light emitting device according to claim 1, wherein the vertical geometry light emitting diode is a gallium nitride-based vertical geometry light emitting diode.

9. The light emitting device according to claim 1, wherein the conductive connecting member is a metal member having ribbon-shaped arms or a metal member in shape of a ribbon overall that is made of gold, silver, copper, or copper plated with at least one type of metal selected from the group consisting of gold, silver, and nickel on the surface thereof.

10. A method for producing the light emitting device according to claim 1.

11. A light emitting device comprising:
a package having a plurality of mutually separated package electrodes;
a vertical geometry light emitting diode having a light emitting layer positioned between a p-type semiconductor layer and an n-type semiconductor layer, an upper partial electrode of an uppermost layer, and a lower electrode of a lowermost layer, wherein the lower electrode is joined onto one of the package electrodes; and,
a conductive connecting member that connects the upper electrode of the vertical geometry light emitting diode with another one of the package electrodes,
wherein a junction between said one of the package electrodes and the lower electrode, a junction between the upper electrode and the conductive connecting member, and a junction between the conductive connecting member and said other of the package electrodes are made with solder, and wherein the package is comprised of a ceramic substrate, a plurality of package electrodes formed mutually separated on the ceramic substrate, and a reflector joined to the ceramic substrate.

12. The light emitting device according to claim 11, wherein the reflector has an opening that surrounds the vertical geometry light emitting diode, the lower electrode of which is joined to said one of the package electrodes, and the opening is filled with a transparent sealing material.

13. The light emitting device according to claim 11, wherein the reflector is comprised of an alumina-based or alumina and glass compound ceramic member, and is joined to the electrode portion by a resin-based, glass-based or brazing material-based adhesive.

14. The light emitting device according to claim 12, wherein the transparent sealing material is comprised of a resin or elastomer having a Shore A hardness of 15 to 85 and preferably 20 to 80.

15. The light emitting device according to claim 14, wherein the transparent sealing material is a one-pack or two-pack type of thermosetting silicone-based resin or elastomer.

16. The light emitting device according to claim 12, further comprising a fluorescent material-containing film on the upper portion of the reflector opening.

17. The light emitting device according to claim 13, further comprising a fluorescent material-containing film on the upper portion of the reflector opening.

18. The light emitting device according to claim 11, wherein the vertical geometry light emitting diode is a gallium nitride-based vertical geometry light emitting diode.

19. The light emitting device according to claim 11, wherein the conductive connecting member is a metal member having ribbon-shaped arms or a metal member in shape of a ribbon overall that is made of gold, silver, copper, or copper plated with at least one type of metal selected from the group consisting of gold, silver, and nickel on the surface thereof.

20. A method for producing the light emitting device according to claim 11.

* * * * *